United States Patent
Griffiths

(10) Patent No.: US 9,525,146 B2
(45) Date of Patent: Dec. 20, 2016

(54) ORGANIC SEMICONDUCTOR COMPOSITIONS

(75) Inventor: Russell Jon Griffiths, Bolton (GB)

(73) Assignee: Smartkem Limited (GB)

(*) Notice: Subject to any disclaimer, the term of this patent is extended or adjusted under 35 U.S.C. 154(b) by 224 days.

(21) Appl. No.: 14/122,326

(22) PCT Filed: May 30, 2012

(86) PCT No.: PCT/GB2012/051213
§ 371 (c)(1),
(2), (4) Date: Jan. 28, 2014

(87) PCT Pub. No.: WO2012/164282
PCT Pub. Date: Dec. 6, 2012

(65) Prior Publication Data
US 2014/0131689 A1    May 15, 2014

(30) Foreign Application Priority Data
May 31, 2011 (GB) .................... 1109075.0

(51) Int. Cl.
*H01L 51/00* (2006.01)
*H01L 51/05* (2006.01)

(52) U.S. Cl.
CPC ....... *H01L 51/0094* (2013.01); *H01L 51/0055* (2013.01); *H01L 51/0059* (2013.01);
(Continued)

(58) Field of Classification Search
CPC ............. H01L 51/0094; H01L 51/0055; H01L 51/0059; H01L 51/0074; H01L 51/0566; Y02E 10/549
(Continued)

(56) References Cited

U.S. PATENT DOCUMENTS 3,557,233 A    1/1971    Zweig et al.
6,690,029 B1   2/2004    Anthony et al.
(Continued)

FOREIGN PATENT DOCUMENTS

WO    2004102690 A2    11/2004
WO    2005055248 A2    6/2005
(Continued)

OTHER PUBLICATIONS

Holland, et al., "Effects of order and disorder on field-effect mobilities measured in conjugated polymer thin-film transistors", J. Appl. Phys., 1994, vol. 75, p. 7954.
(Continued)

*Primary Examiner* — Mark Kopec
*Assistant Examiner* — Danny N Kang
(74) *Attorney, Agent, or Firm* — Lerner, David, Littenberg, Krumholz & Mentlik, LLP

(57) ABSTRACT

The present invention relates to organic semiconductor compositions and organic semiconductor layers and devices comprising such organic semiconductor compositions. The invention is also concerned with methods of preparing such organic semiconductor compositions and layers and uses thereof. The invention has application particularly in the field of displays such as organic field effect transistors (OFETS), integrated circuits, organic light emitting diodes (OLEDS), photodetectors, organic photovoltaic (OPV) cells, sensors, lasers, memory elements and logic circuits.

41 Claims, 1 Drawing Sheet

(52) U.S. Cl.
CPC ...... *H01L 51/0074* (2013.01); *H01L 51/0566* (2013.01); *Y02E 10/549* (2013.01)

(58) Field of Classification Search
USPC .......................................................... 252/500
See application file for complete search history.

(56) References Cited

U.S. PATENT DOCUMENTS

| | | |
|---|---|---|
| 2003/0116755 A1 | 6/2003 | Takahashi |
| 2004/0038459 A1* | 2/2004 | Brown ................ H01L 51/0035 438/142 |
| 2004/0222412 A1 | 11/2004 | Bai et al. |
| 2007/0146426 A1 | 6/2007 | Nelson et al. |
| 2007/0158643 A1* | 7/2007 | Vogel .................. H01L 51/0055 257/40 |
| 2010/0127220 A1* | 5/2010 | Tierney ................ C07F 7/0809 252/500 |

FOREIGN PATENT DOCUMENTS

| | | |
|---|---|---|
| WO | 2007078993 A1 | 7/2007 |
| WO | 2007082584 A1 | 7/2007 |
| WO | WO 2007078993 A1 * | 7/2007 |
| WO | 2008128618 A1 | 10/2008 |
| WO | 2009155106 A1 | 12/2009 |
| WO | 2012160382 A1 | 11/2012 |
| WO | 2012160383 A1 | 11/2012 |

OTHER PUBLICATIONS

International Search Report for Application No. PCT/GB2012/051213 dated Sep. 4, 2012.
J. R. Wunsch, Polystyrene-Synthesis, Production and Applications, Rapra Review Reports, 2000, vol. 1 0, No. 4, p. 32.
Jang Yunseok et al: "Influence of the dielectric constant of a polyvinyl phenol insulator on the field-effect mobility of a pentacene-based thin-film transistor". Applied Physics Letters, AIP, American Institute of Physics, Melville, NY, US, vol. 87, No. 15, Oct. 5, 2005, pp. 152105-152105, XP012075960.
Myung-Ho Chung et al: "Polymer binder effects on the electrical characteristics of 6, 13-bis (triisopropylsilylethynyl)-pentacene thin-film transistors in different solvents", Thin Solid Films, vol. 518, No. 22, Sep. 1, 2010, pp. 6289-6294, XP55011665.
Payne, et al., "Robust, Soluble Pentacene Ethers", Organic Letters, 2004, vol. 6, No. 10, pp. 1609-1612.

* cited by examiner

ORGANIC SEMICONDUCTOR COMPOSITIONS

CROSS-REFERENCE TO RELATED APPLICATIONS

This application is a U.S. National Stage filing of PCT/GB2012/051213 filed May 30, 2012 which claims priority of Great Britain Patent Application No. 1109075.0 filed May 31, 2011, the disclosures of which are incorporated herein by reference.

FIELD OF THE INVENTION

The present invention relates to organic semiconductor compositions and organic semiconductor layers and devices comprising such organic semiconductor compositions. The invention is also concerned with methods of preparing such organic semiconductor compositions and layers and uses thereof. The invention has application particularly in the field of displays such as organic field effect transistors (OFETs), integrated circuits, organic light emitting diodes (OLEDs), photodetectors, organic photovoltaic (OPV) cells, sensors, lasers, memory elements and logic circuits.

BACKGROUND OF THE INVENTION

In recent years, there has been an increasing interest in organic semiconducting materials as an alternative to the conventional silicon-based semiconductors. Organic semiconducting materials have several advantages over those based on silicon, such as low cost and ease of manufacturing as well as increased flexibility, mechanical robustness, good compatibility with a wide variety of flexible substrates and light weight. They thus offer the possibility of producing more convenient and high performance electronic devices.

Polyacene compounds in particular have shown promise in this field of technology. WO 2005/055248 for example, discloses an organic semiconducting layer formulation comprising an organic binder which has a permittivity ($\in$) at 1000 Hz of 3.3 or less, and a polyacene compound. However the method for preparing the OFETs described in WO 2005/055248 in practice is limited and is only useful for producing top gate OFETs. A further disadvantage of WO 2005/055248 that is overcome by the present invention, is that it frequently uses undesirable chlorinated solvents. The highest performance semiconductor compositions disclosed in WO 2005/055248 having mobilities $\geq 1.0$ $cm^2V^{-1}s^{-1}$, incorporated 1,2-dichlorobenzene as the solvent (page 54, Table 5 and examples 14, 21 and 25). Moreover these solvents are not ones that would be industrially useful in a printing process and these are also damaging to the environment. Therefore it would be desirable to use more benign solvents for the manufacture of these semiconductor compositions. Furthermore, it was generally thought that only polymer binders with a permittivity of less than 3.3 could be used since any polymers with a higher permittivity resulted in a very significant reduction in mobility values of the OFET device.

This reduction in mobility value can further be seen in WO 2007/078993 which discloses the use of 2,3,9,10-substituted pentacene compounds in combination with a polymer having a dielectric constant at 1000 Hz of greater than 3.3. These compositions are reported to exhibit mobility values of between $10^{-2}$ and $10^{-7}$ $cm^2V^{-1}s^{-1}$ which are too low to be industrially useful.

Therefore, the present invention seeks to provide organic semiconductor compositions, which overcome the above-mentioned problems, by providing polyacene compounds in combination with organic binders having an acceptable permittivity value, which exhibit high mobility values and which are soluble in a range of non-chlorinated solvents.

SUMMARY OF THE INVENTION

Polyacene Compounds

Polyacene compounds according to the present invention are of Formula (1):

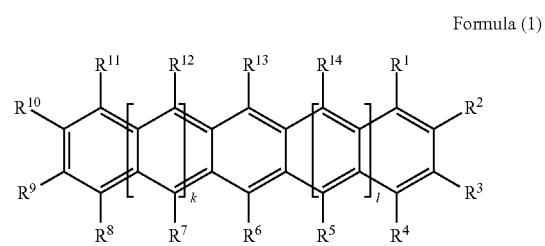

Formula (1)

wherein each of $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$, which may be the same or different, independently represents hydrogen; a branched or unbranched, substituted or unsubstituted $C_1$-$C_{40}$ alkyl group; a branched or unbranched, substituted or unsubstituted $C_2$-$C_{40}$ alkenyl group; a branched or unbranched, substituted or unsubstituted $C_2$-$C_{40}$ alkynyl group; an optionally substituted $C_3$-$C_{40}$ cycloalkyl group; an optionally substituted $C_6$-$C_{40}$ aryl group; an optionally substituted $C_1$-$C_{40}$ heterocyclic group; an optionally substituted $C_1$-$C_{40}$ heteroaryl group; an optionally substituted $C_1$-$C_{40}$ alkoxy group; an optionally substituted $C_6$-$C_{40}$ aryloxy group; an optionally substituted $C_7$-$C_{40}$ alkylaryloxy group; an optionally substituted $C_2$-$C_{40}$ alkoxycarbonyl group; an optionally substituted $C_7$-$C_{40}$ aryloxycarbonyl group; a cyano group (—CN); a carbamoyl group (—C(=O)NR$^{15}$R$^{16}$); a carbonyl group (—C(C=O)—R$^{17}$); a carboxyl group (—CO$_2$R$^{18}$) a cyanate group (—OCN); an isocyano group (—NC); an isocyanate group (—NCO); a thiocyanate group (—SCN) or a thioisocyanate group (—NCS); an optionally substituted amino group; a hydroxy group; a nitro group; a $CF_3$ group; a halo group (Cl, Br, F, I); —SR$^{19}$; —SO$_3$H; —SO$_2$R$^{20}$; —SF$_5$; an optionally substituted silyl group; a $C_2$-$C_{10}$ alkynyl group substituted with a SiH$_2$R$^{22}$ group, a $C_2$-$C_{10}$ alkynyl substituted with a SiHR$^{22}$R$^{23}$ group, or a $C_2$-$C_{10}$ alkynyl substituted with a SiR$^{22}$R$^{23}$R$^{24}$ group;

wherein each of $R^{15}$, $R^{16}$, $R^{18}$, $R^{19}$ and $R^{20}$ independently represent H or optionally substituted $C_1$-$C_{40}$ carbyl or hydrocarbyl group optionally comprising one or more heteroatoms;

wherein $R^{17}$ represents a halogen atom, H or optionally substituted $C_1$-$C_{40}$ carbyl or $C_1$-$C_{40}$ hydrocarbyl group optionally comprising one or more heteroatoms;

wherein, independently, each pair of $R^2$ and $R^3$ and/or $R^9$ and $R^{10}$, may be cross-bridged to form a $C_4$-$C_{40}$ saturated or unsaturated ring, which saturated or unsaturated ring may be intervened by an oxygen atom, a sulphur atom or a group shown by formula —N(R$^{21}$)— (wherein $R^{21}$ is a hydrogen atom or an optionally substituted $C_1$-$C_{40}$ hydrocarbon group), or may optionally be substituted; and wherein one or more of the carbon atoms of the polyacene skeleton may optionally be substituted by a heteroatom selected from N, P, As, O, S, Se and Te;

wherein $R^{22}$, $R^{23}$ and $R^{24}$ are independently selected from the group consisting of hydrogen, a $C_1$-$C_{40}$ alkyl group which may optionally be substituted for example with a halogen atom; a $C_6$-$C_{40}$ aryl group which may optionally be substituted for example with a halogen atom; a $C_7$-$C_{40}$ arylalkyl group which may optionally be substituted for example with a halogen atom; a $C_1$-$C_{40}$ alkoxy group which may optionally be substituted for example with a halogen atom; or a $C_7$-$C_{40}$ arylalkyloxy group which may optionally be substituted for example with a halogen atom;

wherein independently any two or more of the substituents $R^1$-$R^{14}$ which are located on adjacent ring positions of the polyacene may, together, optionally constitute a further $C_4$-$C_{40}$ saturated or unsaturated ring optionally interrupted by O, S or —N($R^{21}$) where $R^{21}$ is as defined above; or an aromatic ring system, fused to the polyacene; and wherein k and l are independently 0, 1 or 2.

Preferably, k=l=0 or 1.

Preferably, k=1 and l=1.

In a preferred embodiment, at least one (and more preferably 2) of groups $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are tri-$C_{1-20}$ hydrocarbylsilyl $C_{1-4}$ alkynyl groups (i.e., $C_{1-20}$ hydrocarbyl-$SiR^{22}R^{23}R^{24}$), wherein $R^{22}$, $R^{23}$ and $R^{24}$ independently represent $C_1$-$C_6$ alkyl or $C_2$-$C_6$ alkenyl.

In a preferred embodiment, at least one (and more preferably 2) of groups $R^1$, $R^2$, $R^3$, $R^4$, $R^5$, $R^6$, $R^7$, $R^8$, $R^9$, $R^{10}$, $R^{11}$, $R^{12}$, $R^{13}$ and $R^{14}$ are trihydrocarbylsilyl ethynyl groups (—C≡C—$SiR^{22}R^{23}R^{24}$), wherein $R^{22}$, $R^{23}$ and $R^{24}$ independently represent $C_1$-$C_6$ alkyl or $C_2$-$C_6$ alkenyl. In a more preferred embodiment, $R^{22}$, $R^{23}$ and $R^{24}$ are independently selected from the group consisting of methyl, ethyl, propyl, isopropyl, n-butyl, isobutyl, t-butyl, 1-propenyl and 2-propenyl.

In a preferred embodiment, $R^6$ and $R^{13}$ are trialkylsilyl ethynyl groups (—C≡C—$SiR^{22}R^{23}R^{24}$), wherein $R^{22}$, $R^{23}$ and $R^{24}$ independently represent $C_1$-$C_6$ alkyl or $C_2$-$C_6$ alkenyl. In a more preferred embodiment, $R^{22}$, $R^{23}$ and $R^{24}$ are independently selected from the group consisting of methyl, ethyl, propyl, isopropyl, n-butyl, isobutyl, t-butyl 1-propenyl and 2-propenyl.

In yet another preferred embodiment, when k=l=1; $R^1$, $R^2$, $R^3$, $R^4$, $R^8$, $R^9$, $R^{10}$ and $R^{11}$ independently represent H, $C_1$-$C_6$ alkyl or $C_1$-$C_6$ alkoxy. More preferably, $R^1$, $R^4$, $R^8$ and $R^{11}$ are the same and represent H, $C_1$-$C_6$ alkyl or $C_1$-$C_6$ alkoxy. In an even more preferred embodiment, $R^1$, $R^2$, $R^3$, $R^4$, $R^8$, $R^9$, $R^{10}$ and $R^{11}$ are the same or different and are selected from the group consisting of hydrogen, methyl, ethyl, propyl, n-butyl, isobutyl, t-butyl, methoxy, ethoxy, propyloxy and butyloxy.

In yet another embodiment, when k=l=0 or 1, independently each pair of $R^2$ and $R^3$ and/or $R^9$ and $R^{10}$, are cross-bridged to form a $C_4$-$C_{10}$ saturated or unsaturated ring, which saturated or unsaturated ring may be intervened by an oxygen atom, a sulphur atom or a group shown by formula —N($R^{21}$)— (wherein $R^{21}$ is a hydrogen atom or a cyclic, straight chain or branched $C_1$-$C_{10}$ alkyl group); and wherein one or more of the carbon atoms of the polyacene skeleton may optionally be substituted by a heteroatom selected from N, P, As, O, S, Se and Te.

Preferably, $R^5$, $R^7$, $R^{12}$ and $R^{14}$ are hydrogen.

Preferably, $R^{22}$, $R^{23}$ and $R^{24}$ are independently selected from the group consisting hydrogen, a $C_1$-$C_{10}$ alkyl group (preferably $C_1$-$C_4$-alkyl and most preferably methyl, ethyl, n-propyl or isopropyl) which may optionally be substituted for example with a halogen atom; a $C_6$-$C_{12}$ aryl group (preferably phenyl) which may optionally be substituted for example with a halogen atom; a $C_7$-$C_{16}$ arylalkyl group which may optionally be substituted for example with a halogen atom; a $C_1$-$C_{10}$ alkoxy group which may optionally be substituted for example with a halogen atom; or a $C_7$-$C_{16}$ arylalkyloxy group which may optionally be substituted for example with a halogen atom.

$R^{22}$, $R^{23}$ and $R^{24}$ are preferably independently selected from the group consisting optionally substituted $C_{1-10}$ alkyl group and optionally substituted $C_{2-10}$ alkenyl, more preferably $C_1$-$C_6$ alkyl or $C_2$-$C_6$ alkenyl. A preferred alkyl group in this case is isopropyl.

Examples of the silyl group —$SiR^{22}R^{23}R^{24}$ include, without limitation, trimethylsilyl, triethylsilyl, tripropylsilyl, dimethylethylsilyl, diethylmethylsilyl, dimethylpropylsilyl, dimethylisopropylsilyl, dipropylmethylsilyl, diisopropylmethylsilyl, dipropylethylsilyl, diisopropylethylsilyl, diethylisopropylsilyl, triisopropylsilyl, trimethoxysilyl, triethoxysilyl, triphenylsilyl, diphenylisopropylsilyl, diisopropylphenylsilyl, diphenylethylsilyl, diethylphenylsilyl, diphenylmethylsilyl, triphenoxysilyl, dimethylmethoxysilyl, dimethylphenoxysilyl, methylmethoxyphenyl, etc. For each example in the foregoing list, the alkyl, aryl or alkoxy group may optionally be substituted.

In a preferred embodiment of the first aspect of the invention, polyacene compounds according to the present invention are of Formula (1a):

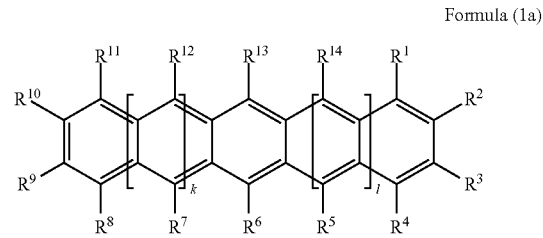

Formula (1a)

wherein each of $R^5$, $R^7$, $R^{12}$ and $R^{14}$ are hydrogen;

$R^6$ and $R^{13}$ are trialkylsilyl ethynyl groups (—C≡C—$SiR^{22}R^{23}R^{24}$), wherein $R^{22}$, $R^{23}$ and $R^{24}$ independently represent $C_1$-$C_4$ alkyl or $C_2$-$C_4$ alkenyl;

$R^1$, $R^2$, $R^3$, $R^4$, $R^8$, $R^9$, $R^{10}$ and $R^{11}$ are independently selected from the group consisting of hydrogen; a branched or unbranched, unsubstituted $C_1$-$C_4$ alkyl group; $C_1$-$C_6$ alkoxy group and $C_6$-$C_{12}$ aryloxy group;

or wherein independently each pair of $R^2$ and $R^3$ and/or $R^9$ and $R^{10}$, may be cross-bridged to form a $C_4$-$C_{10}$ saturated or unsaturated ring, which saturated or unsaturated ring may be intervened by an oxygen atom, a sulphur atom or a group shown by formula —N($R^{21}$)— (wherein $R^{21}$ is a hydrogen atom or an optionally substituted $C_1$-$C_6$ alkyl group);

wherein k and l are independently 0, or 1, preferably both k and l are 1.

In compounds of Formula (1a), wherein k and l are both 1; $R^6$ and $R^{13}$ are trialkylsilyl ethynyl groups (—C≡C—$SiR^{22}R^{23}R^{24}$), wherein $R^{22}$, $R^{23}$ and $R^{24}$ are preferably selected from ethyl, n-propyl, isopropyl, 1-propenyl or 2-propenyl; $R^1$, $R^2$, $R^3$, $R^4$, $R^8$, $R^9$, $R^{10}$ and $R^{11}$ are independently selected from the group consisting of hydrogen, methyl, ethyl and methoxy.

In compounds of Formula (1a), wherein k and l are both 0; $R^6$ and $R^{13}$ are preferably trialkylsilyl ethynyl groups (—C≡C—$SiR^{22}R^{23}R^{24}$), wherein $R^{22}$, $R^{23}$ and $R^{24}$ are preferably selected from ethyl, n-propyl, isopropyl, 1-propenyl or 2-propenyl; $R^1$, $R^4$, $R^8$ and $R^{11}$ are preferably hydrogen; and $R^2$ and $R^3$ together, and $R^9$ and $R^{10}$ together preferably form 5-membered heterocyclic rings containing 1 or 2 nitrogen atoms, 1 or 2 sulphur atoms or 1 or 2 oxygen atoms.

Especially preferred polyacene compounds according to the present invention are those of Formulae (2) and (3):

Formula (2)

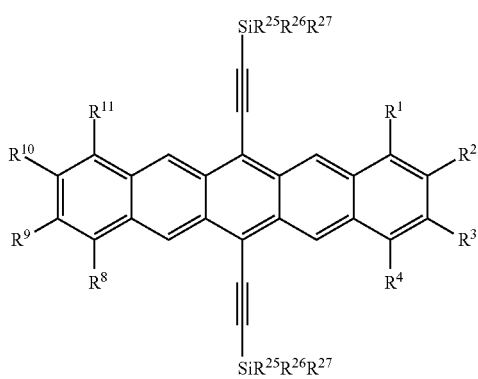

Formula (3)

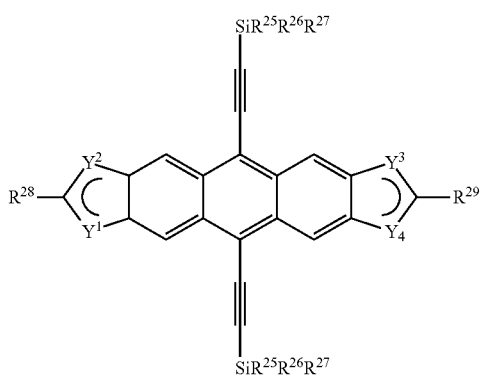

wherein $R^1$, $R^4$, $R^8$ and $R^{11}$ are independently selected from the group consisting of H, $C_1$-$C_6$ alkyl and $C_1$-$C_6$ alkoxy. Preferably $R^1$, $R^4$, $R^8$ and $R^{11}$ are the same or different and are independently selected from the group consisting of hydrogen, methyl, ethyl, propyl, n-butyl, isobutyl, t-butyl, methoxy, ethoxy, propyloxy and butyloxy, more preferably hydrogen, methyl, propyl and methoxy.

In compounds of Formula (2), $R^2$, $R^3$, $R^9$ and $R^{10}$ are independently selected from the group consisting of H, $C_1$-$C_6$ alkyl and $C_1$-$C_6$ alkoxy, or each pair of $R^2$ and $R^3$ and/or $R^9$ and $R^{10}$, are cross-bridged to form a $C_4$-$C_{10}$ saturated or unsaturated ring, which saturated or unsaturated ring may be intervened by an oxygen atom, a sulphur atom or a group shown by formula —N($R^{21}$)— (wherein $R^{21}$ is a hydrogen atom or a cyclic, straight chain or branched $C_1$-$C_{10}$ alkyl group); and wherein one or more of the carbon atoms of the polyacene skeleton may optionally be substituted by a heteroatom selected from N, P, As, O, S, Se and Te. In a preferred embodiment, $R^2$, $R^3$, $R^9$ and $R^{10}$ are the same or different and are independently selected from the group consisting of hydrogen, methyl, ethyl, propyl, n-butyl, isobutyl, t-butyl, methoxy, ethoxy, propyloxy and butyloxy, more preferably hydrogen, methyl, ethyl, propyl and methoxy;

In compounds of Formulae (2) and (3), $R^{25}$, $R^{26}$ and $R^{27}$ are independently selected from the group consisting of $C_1$-$C_6$ alkyl and $C_2$-$C_6$ alkenyl, preferably $R^{22}$, $R^{23}$ and $R^{24}$ are independently selected from the group consisting of methyl, ethyl, propyl, isopropyl, n-butyl, isobutyl, t-butyl, 1-propenyl and 2-propenyl, more preferably ethyl, n-propyl and isopropyl.

In compounds of Formula (3), $R^{28}$ and $R^{29}$ are independently selected from the group consisting of hydrogen, halogen, —CN, optionally fluorinated or perfluorinated, straight chain or branched $C_1$-$C_{20}$ alkyl, fluorinated or perfluorinated, straight chain or branched $C_1$-$C_{20}$ alkoxy, fluorinated or perfluorinated $C_6$-$C_{30}$ aryl and $CO_2R^{30}$, wherein $R^{30}$ is H, fluorinated or perfluorinated, straight chain or branched $C_1$-$C_{20}$ alkyl, and fluorinated or perfluorinated $C_6$-$C_{30}$ aryl. Preferably $R^{28}$ and $R^{29}$ are independently selected from the group consisting of fluorinated or perfluorinated, straight chain or branched $C_1$-$C_8$ alkyl, fluorinated or perfluorinated, straight chain or branched $C_1$-$C_8$ alkoxy and $C_6F_5$.

In compounds of Formula (3), $Y^1$, $Y^2$, $Y^3$ and $Y^4$ are preferably independently selected from the group consisting of —CH=, =CH—, O, S, Se or $NR^{31}$ (wherein $R^{31}$ is a hydrogen atom or a cyclic, straight chain or branched $C_1$-$C_{10}$ alkyl group).

In yet another preferred embodiment, the polyacene compounds of the present invention are those of Formulae (4) and (5):

Formula (4)

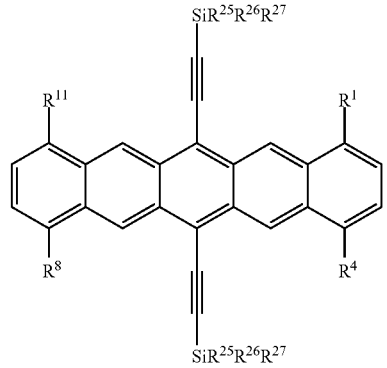

Formula (5)

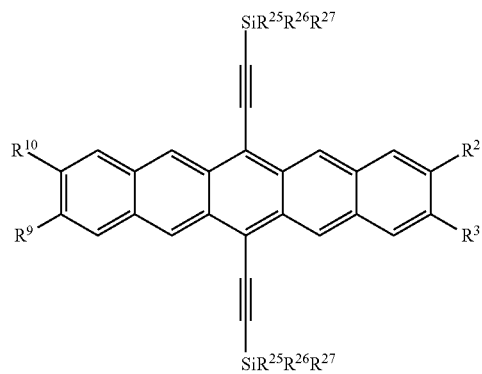

wherein $R^{25}$, $R^{26}$ and $R^{27}$ are independently selected from the group consisting of methyl, ethyl and isopropyl;

wherein $R^1$, $R^2$, $R^3$, $R^4$, $R^8$, $R^9$, $R^{10}$ and $R^{11}$ are independently selected from the group consisting of $C_1$-$C_6$ alkyl, $C_1$-$C_6$ alkoxy and $C_6$-$C_{20}$ aryloxy. Preferably $R^1$, $R^2$, $R^3$, $R^4$, $R^8$, $R^9$, $R^{10}$ and $R^{11}$ are independently selected from the group consisting of methyl, ethyl, propyl, n-butyl, isobutyl, t-butyl, methoxy, ethoxy, propyloxy and butyloxy groups.

In some preferred embodiments, when $R^1$, $R^4$, $R^8$ and $R^{11}$ are the same and are methyl or methoxy groups, $R^{25}$, $R^{26}$ and $R^{27}$ are the same and are ethyl or isopropyl groups. In a preferred embodiment, when $R^1$, $R^4$, $R^8$ and $R^{11}$ are methyl groups, $R^{25}$, $R^{26}$ and $R^{27}$ are ethyl groups. In yet another a preferred embodiment, when $R^1$, $R^4$, $R^8$ and $R^{11}$ are methyl groups, $R^{25}$, $R^{26}$ and $R^{27}$ are isopropyl groups. In a further preferred embodiment, when $R^1$, $R^4$, $R^8$ and $R^{11}$ are methoxy groups, $R^{25}$, $R^{26}$ and $R^{27}$ are ethyl groups. In yet another preferred embodiment, when $R^1$, $R^4$, $R^8$ and $R^{11}$ are methoxy groups, $R^{25}$, $R^{26}$ and $R^{27}$ are isopropyl groups.

In some preferred embodiments when $R^2$, $R^3$, $R^9$ and $R^{10}$ are the same and are methyl or methoxy groups, $R^{25}$, $R^{26}$ and $R^{27}$ are the same and are ethyl or isopropyl groups. In a preferred embodiment, when $R^2$, $R^3$, $R^9$ and $R^{10}$ are methyl groups, $R^{25}$, $R^{26}$ and $R^{27}$ are ethyl groups. In yet another a preferred embodiment, when $R^2$, $R^3$, $R^9$ and $R^{10}$ are methyl groups, $R^{25}$, $R^{26}$ and $R^{27}$ are isopropyl groups. In a further preferred embodiment, when $R^2$, $R^3$, $R^9$ and $R^{10}$ are methoxy groups, $R^{25}$, $R^{26}$ and $R^{27}$ are ethyl groups. In yet another preferred embodiment, when $R^2$, $R^3$, $R^9$ and $R^{10}$ are methoxy groups, $R^{25}$, $R^{26}$ and $R^{27}$ are isopropyl groups.

In an even more preferred embodiment of the present invention, the polyacene compound is selected from the following compounds (A) to (F):

Compound (A)

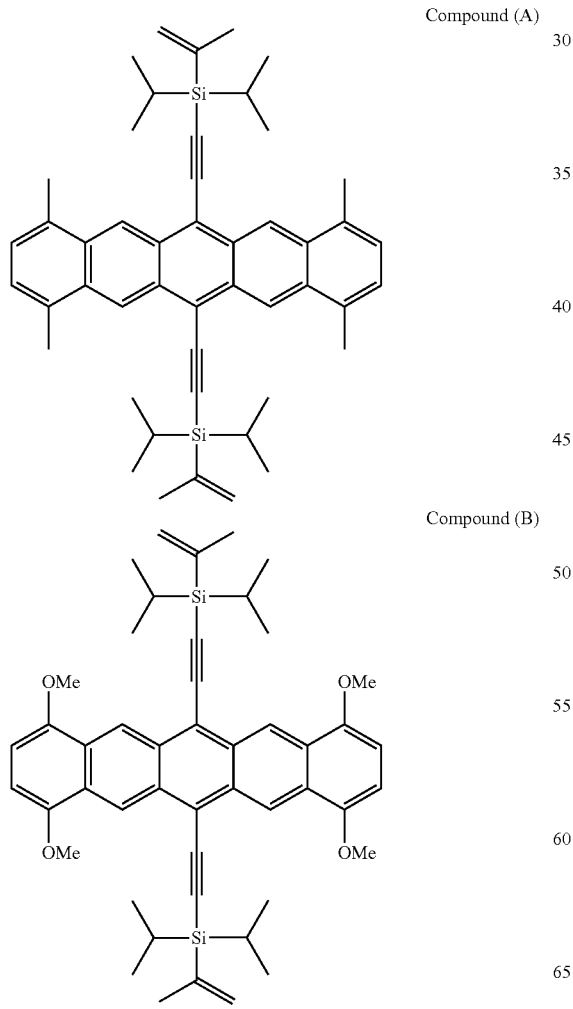

Compound (B)

Compound (C)

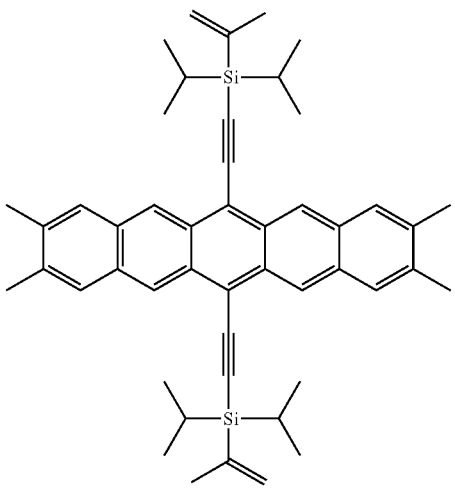

Compound (D)

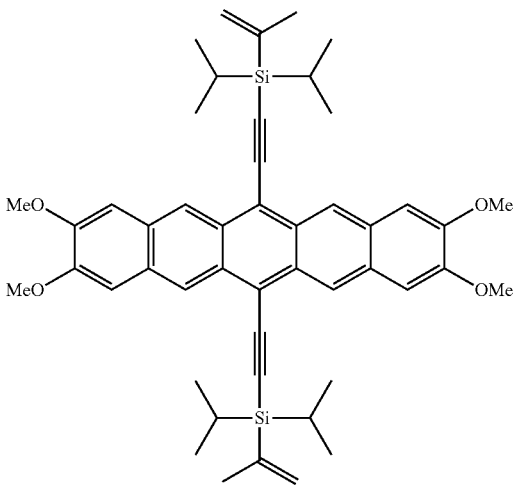

Compound (E)

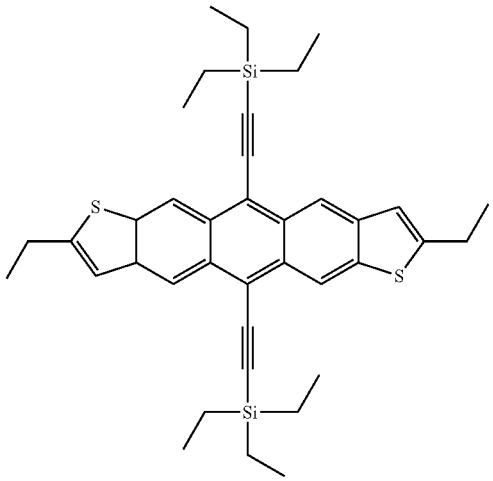

Compound (F)

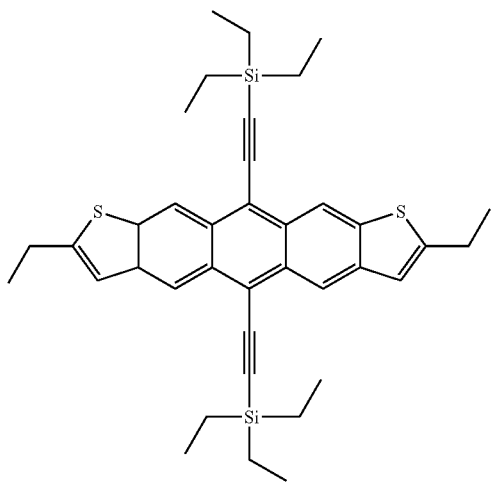

The "R" substituents (that is $R^1$, $R^2$, etc) denote the substituents at the positions of pentacene according to conventional nomenclature:

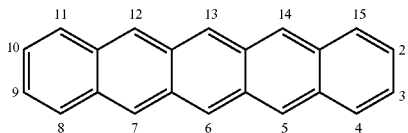

Polyacene compounds according to the present invention may be synthesised by any known method within the common general knowledge of a person skilled in the art. In a preferred embodiment, methods disclosed in US 2003/0116755 A, U.S. Pat. Nos. 3,557,233, 6,690,029 WO 2007/078993, WO 2008/128618 and *Organic Letters,* 2004, Volume 6, number 10, pages 1609-1612 can be employed for the synthesis of polyacene compounds according to the present invention.

Preferably, the polyacene compounds according to the present invention have an electrical conductivity in the range of $10^3$ to $10^{-8}$ siemens per centimetre, preferably between 500 to $10^{-7}$, more preferably between 300 to $10^{-6}$, more preferably between 250 to $10^{-5}$, more preferably between 10 to $10^{-5}$ siemens per centimetre, more preferably greater than $10^{-4}$ or $10^{-3}$ siemens per centimetre.

Organic Binders

Organic binders according to the present invention are semiconducting binders having a permittivity at 1000 Hz of between 3.4 and 8. In a preferred embodiment, the organic binders have a permittivity at 1000 Hz of between 3.4 and 6.0, and more preferably between 3.4 and 4.5. The permittivity of the organic binders can be measured using any standard method known to those skilled in the art. In a preferred embodiment, the permittivity is determined by the method disclosed in WO 2004/102690 or by using the method disclosed herein, preferably by using the method disclosed herein.

In a preferred embodiment, the organic binders according to the present invention are those comprising a unit of Formula (6):

Formula (6)

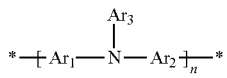

wherein $Ar_1$, $Ar_2$ and $Ar_3$, which may be the same or different, each represent, independently if in different repeat units, an optionally substituted $C_{6-40}$ aromatic group (mononuclear or polynuclear), wherein at least one of $Ar_1$, $Ar_2$ and $Ar_3$ is substituted with at least one polar or more polarising group, and n=1 to 20, preferably 1 to 10 and more preferably 1 to 5. Preferably, at least one of $Ar_1$, $Ar_2$ and $Ar_3$ is substituted with 1, 2, 3, or 4, more preferably 1, 2 or 3, more preferably 1 or 2, preferably 1 polar or more polarising group(s).

In a preferred embodiment, the one or more polar or polarising group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; $C_{1-40}$ alkoxy group optionally substituted with a nitro group, a nitrile group, a cyanate group, an isocyanate group, a thiocyanate group or a thioisocyanate group; $C_{1-40}$ carboxylic acid group optionally substituted with a nitro group, a nitrile group, a cyanate group, an isocyanate group, a thiocyanate group or a thioisocyanate group; $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

In a more preferred embodiment, the one or more polar or polarising group(s) is independently selected from the group consisting of nitro group, nitrile group, $C_{1-10}$ alkyl group substituted with a nitrile group, a cyanate group, or an isocyanate group; $C_{1-20}$ alkoxy group, $C_{1-20}$ carboxylic acid group, $C_{2-20}$ carboxylic acid ester; sulfonic acid ester; cyanate group, isocyanate group, thiocyanate group, thioisocyanate group, and an amino group; and combinations thereof.

More preferably the polar or polarizing group is selected from the group consisting of $C_{1-4}$ cyanoalkyl group, $C_{1-10}$ alkoxy group, nitrile group and combinations thereof.

More preferably the polar or polarizing group is selected from the group consisting of cyanomethyl, cyanoethyl, cyanopropyl, cyanobutyl, methoxy, ethoxy, propoxy, butoxy, nitrile, $NH_2$ and combinations thereof. Preferably at least one of $Ar_1$, $Ar_2$ and $Ar_3$ is substituted with 1 or 2 polar or more polarising group, which may be the same or different.

In the context of $Ar_1$, $Ar_2$ and $Ar_3$, a mononuclear aromatic group has only one aromatic ring, for example phenyl or phenylene. A polynuclear aromatic group has two or more aromatic rings which may be fused (for example napthyl or naphthylene), individually covalently linked (for example biphenyl) and/or a combination of both fused and individually linked aromatic rings. Preferably each $Ar_1$, $Ar_2$ and $Ar_3$ is an aromatic group which is substantially conjugated over substantially the whole group.

Preferably, $Ar_1$, $Ar_2$ and $Ar_3$, are independently selected from the group consisting of $C_{6-20}$ aryl, $C_{7-20}$ aralkyl and $C_{7-20}$ alkaryl, any of which may be substituted with 1, 2, or 3 groups independently selected from $C_{1-4}$ alkoxy, $C_{1-4}$ cyanoalkyl, CN and mixtures thereof, and n=1 to 10.

Preferably, $Ar_1$, $Ar_2$ and $Ar_3$, are independently selected from the group consisting of $C_{6-10}$ aryl, $C_{7-12}$ aralkyl and $C_{7-12}$ alkaryl, any of which may be substituted with 1, 2, or 3 groups independently selected from $C_{1-2}$ alkoxy, $C_{1-3}$ cyanoalkyl, CN and mixtures thereof, and n=1 to 10.

Preferably, $Ar_1$, $Ar_2$ and $Ar_3$, are independently selected from the group consisting of phenyl, benzyl, tolyl and naphthyl, any of which may be substituted with 1, 2 or 3 groups independently selected from methoxy, ethoxy, cyanomethyl, cyanoethyl, CN and mixtures thereof, and n=1 to 10.

Preferably, $Ar_1$, $Ar_2$ and $Ar_3$, are all phenyl which may be independently substituted with 1, 2 or 3 groups selected from methoxy, ethoxy, cyanomethyl, cyanoethyl, CN and mixtures thereof, and n=1 to 10.

Preferably, $Ar_1$, $Ar_2$ and $Ar_3$, are all phenyl which may be independently substituted with 1 or 2 groups selected from methoxy, cyanomethyl, CN and mixtures thereof, and n=1 to 10.

In a further preferred embodiment, the organic binder may be a random or block copolymer of different triarylamine monomers. In such a case, any compound as defined by Formula (6) may be combined with a different compound of Formula (6) to provide the random or block copolymer according to the present invention. For example, the organic binder may be a copolymer of a nitro-substituted triarylamine with a 2,4-dimethyl substituted triarylamine. The ratio of the monomers in the polymers can be altered to allow for adjustment of the permittivity relative to a homopolymer. Furthermore, preferably the organic binder (6) may be mixed with organic binders which do not meet the definition of (6), as long as the average permittivity of the compositions is between 3.4 and 8.0.

In an even more preferred embodiment of the present invention, the organic binder comprises at least one unit having the structures (G) to (J):

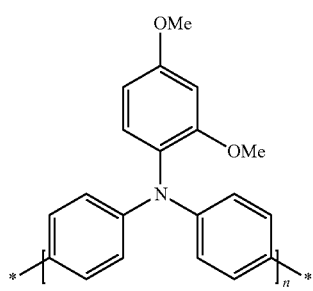

Compound (G)

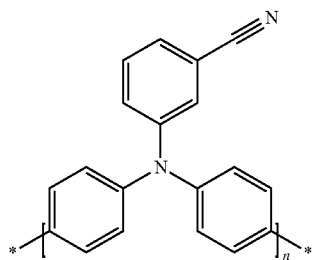

Compound (H)

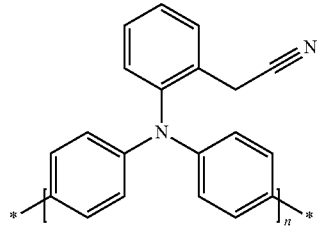

Compound (I)

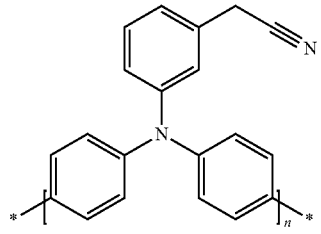

Compound (J)

The organic binders according to the present invention preferably have a number average molecular weight (Mn) of between 300 and 20,000, more preferably between 1600 and 5000, more preferably between 500 and 4000, even more preferably between 450 and 3000 and yet more preferably between 500 and 2000.

Preferably, the organic semiconductor compositions according to the present invention contain less than 10% by weight, more preferably less than 5% by weight, more preferably less than 1% of organic binders which have a permittivity at 1000 Hz of less than 3.4. In a preferred embodiment, the permittivity is determined by the method disclosed in WO 2004/102690 or by using the method disclosed herein, preferably by using the method disclosed herein.

The organic binders according to the present invention preferably have a charge mobility value greater than $\mu=1 \times 10^{-7}$ $cm^2V^{-1}s^{-1}$, and more preferably greater than $\mu=1 \times 10^{-6}$ $cm^2V^{-1}s^{-1}$ Organic Semiconductor Compositions An organic semiconductor composition according to the first aspect of the present invention comprises a polyacene compound and an organic binder, wherein the organic binder has a permittivity at 1000 Hz of between 3.4 and 6.5.

The organic semiconductor composition according to the present invention can comprise any combination of polyacene compound and organic binders herein disclosed. In a preferred embodiment, an organic semiconductor composition may comprise a polyacene compound according to Formula (1) in combination with an organic binder, wherein the organic binder has a permittivity at 1000 Hz of between 3.4 and 8, preferably between 3.4 and 6.5 and more preferably between 3.4 and 4.5.

In a particularly preferred embodiment, a polyacene compound according to any of Formulae (2) to (5) may be used in combination with an organic binder, wherein the organic binder has a permittivity at 1000 Hz of between 3.4 and 8.0, preferably between 3.4 and 6.0 and more preferably between 3.4 and 4.5.

In yet another preferred embodiment, any of polyacene compounds (A) to (F) may be used in combination with an organic binder, wherein the organic binder has a permittivity at 1000 Hz of between 3.4 and 8.0, preferably between 3.4 and 6.5 and more preferably between 3.4 and 4.5.

In another preferred embodiment, an organic semiconductor composition may comprise a polyacene compound according to Formula (1) in combination with an organic binder comprising a unit of Formula (6). Preferably, the organic binder comprising a unit of Formula (6) has a permittivity at 1000 Hz of between 3.4 and 8.0, preferably between 3.4 and 6.5 and more preferably between 3.4 and 4.5.

In yet a further preferred embodiment, an organic semiconductor composition may comprise a polyacene compound according to any of Formulae (2) to (5) in combination with an organic binder comprising a unit of Formula (6).

In yet another preferred embodiment, an organic semiconductor composition may comprise any of polyacene compounds (A) to (F) in combination with an organic binder comprising a unit of Formula (6).

A further preferred organic semiconductor composition may comprise a polyacene compound according to any of Formulae (1) to (5) in combination with any of the organic binders comprising at least one unit having the structures (G) to (J).

The concentration of the polyacene compound, the organic binder and solvent present in the composition will vary depending on the preferred solution coating method, for example ink jet printing compositions require low viscosity, low solids loading compositions, whilst screen printing processes require high viscosity, high solids loading compositions. Following deposition of the semiconductor-binder composition, the solvent is evaporated to afford the semiconductor layer having 1-99.9% by weight of the binder and 0.1 to 99% by weight of the polyacene semiconductor (in the printed or dried state) based on a total weight of the composition; preferably the semiconductor layer having 25 to 75% by weight of the binder and 25 to 75% by weight of the polyacene semiconductor.

In the composition prior to deposition, one or more of the above-described polyacene compounds are preferably present at a concentration of at least 0.1 wt % based on a total weight of the composition. The upper limit of the concentration of the polyacene compound in the composition is often near the solubility limit of that compound in the particular solvent at the temperature of the composition during its application to a substrate such as in the fabrication of an electronic device. Typical compositions of the present invention comprise one of the polyacene compounds at a concentration ranging from about 0.1 wt % to about 20.0 wt % based on a total weight of the composition, more typically, from about 0.5 wt % to about 10.0 wt %, more typically 0.5 to 5.0 wt %.

In the composition prior to deposition, one or more of the above-described organic binders are preferably present at a concentration of at least 0.1 wt % based on a total weight of the composition. Preferred compositions of the present invention comprise one of the organic binders at a concentration ranging from about 0.1 wt % to about 20.0 wt %, more typically, from about 0.5 wt % to about 10.0 wt %, more typically 0.5 to 5.0 wt %.

In the printed or dried composition, one or more of the above-described polyacene compounds are preferably present at a concentration of at least 10 wt % based on a total weight of the composition, preferably between 10 and 90 wt %, more preferably between 20 and 80 wt %, more preferably between 30 and 70 wt %, more preferably between 40 and 60 wt %.

In the printed or dried composition, one or more of the above-described organic binders are preferably present at a concentration of at least 10 wt % based on a total weight of the composition, preferably between 10 and 90 wt %, more preferably between 20 and 80 wt %, more preferably between 30 and 70 wt %, more preferably between 40 and 60 wt %.

In a preferred embodiment, one or more solvents may be present in the organic semiconductor compositions. Suitable solvents include, but are not limited to, organic solvents such as ketones, aromatic hydrocarbons, fluorinated solvents, and the like. Preferably the solvent is selected from the group of aromatic hydrocarbon solvents including benzene, toluene, xylene, ethylbenzene, butylbenzene, anisole, bromomesitylene and tetrahydronapthalene or from tetrahydrofuran, isophorone, butylcyclohexane and cyclohexanone. Solvent blends may also be utilised. Suitable solvent blends include, but are not limited to compositions of the above solvents in conjunction with solvents such as dimethylformamide, dimethylacetamide, dimethylsulfoxide, methyl ethyl ketone, dichloromethane, dichlorobenzene, furfuryl alcohol, dimethoxyethane and ethyl acetate. Such compositions (prior to deposition) preferably contain a suitable solvent in an amount of greater than 50 wt % based on a total weight of the composition, preferably between 60 and 95 wt % based on a total weight of the composition.

In yet another preferred embodiment, one or more additional composition components may be present in the organic semiconductor composition. Suitable additional composition components include, but are not limited to, a polymer additive, a rheological modifier, a surfactant, another semiconductor that is a complementary hole transfer partner for the polyacene compound or a combination thereof. In some exemplary embodiments, the compositions comprise a polymer additive selected from the group consisting of polystyrene, poly(alpha-methylstyrene), poly(pentafluorostyrene), poly(methyl methacrylate), poly(4-cyanomethyl styrene), poly(4-vinylphenol), or any other suitable polymer disclosed in U.S. Patent Application Publication No. 2004/0222412 A1 or U.S. Patent Application Publication No. 2007/0146426 A1. In some desired embodiments, the polymer additive comprises polystyrene, poly (alpha-methylstyrene), poly(pentafluorostyrene) or poly(methyl methacrylate). In some exemplary embodiments, the compositions comprise a surfactant selected from fluorinated surfactants or fluorosurfactants. When present, each additional composition component is independently present in an amount of greater than 0 to about 50 wt % based on a total weight of the composition. Preferably, each additional composition component is independently present in an amount ranging from about 0.0001 to about 10.0 wt % based on a total weight of the composition. For example, when a polymer is present in the composition, the polymer additive is typically present in an amount of greater than 0 to about 5.0 wt %, preferably from about 0.5 to about 3.0 wt % based on a total weight of the composition. For example, when a surfactant is present in the composition, the surfactant is preferably present in an amount of greater than 0 to about 1.0 wt %, more typically, from about 0.001 to about 0.5 wt % based on a total weight of the composition.

The organic semiconductor composition according to the present invention preferably has a charge mobility value of at least 0.5 $cm^2V^{-1}s^{-1}$, preferably between 0.5 and 8.0 $cm^2V^{-1}s^{-1}$, more preferably between 0.5 and 6.0 $cm^2V^{-1}s^{-1}$, more preferably between 0.8 and 5.0 $cm^2V^{-1}s^{-1}$, more preferably between 1 and 5.0 $cm^2V^{-1}s^{-1}$, more preferably between 1.5 and 5.0 $cm^2V^{-1}s^{-1}$, more preferably between 2 and 5.0 $cm^2V^{-1}s^{-1}$. The charge mobility value of the semiconductor composition can be measured using any standard method known to those skilled in the art, such as techniques disclosed in *J. Appl. Phys.*, 1994, Volume 75, page 7954 and WO 2005/055248, preferably by those described in WO 2005/055248.

The organic semiconductor composition according to the present invention may be prepared by any known method within the common general knowledge of a person skilled in the art. In a preferred embodiment, the organic semiconductor composition is prepared by the method disclosed in WO 2005/055248 or by using the method disclosed herein, preferably by using the method disclosed herein.

Preferably, organic semiconductor composition according to the present invention are semiconducting compositions having a permittivity at 1000 Hz of between 3.4 and 8. In a preferred embodiment, the compositions have a permittivity at 1000 Hz of between 4.0 and 7, more preferably between 4.0 and 6.5, more preferably between 4.0 and 6 and even more preferably between 3.4 and 4.5.

Preferably, the organic semiconductor composition according to the present invention has an electrical conductivity in the range of $10^3$ to $10^{-8}$ siemens per centimetre, preferably between 500 to $10^{-7}$, more preferably between 300 to $10^{-6}$, more preferably between 250 to $10^{-5}$, more preferably between 10 to $10^{-5}$ siemens per centimetre, more preferably greater than $10^{-4}$ or $10^{-3}$ siemens per centimetre.

Organic Semiconductor Layers

The organic semiconductor compositions according to the present invention may be deposited onto a variety of substrates, to form organic semiconductor layers.

The organic semiconductor layer according to the present invention may be prepared using a method comprising the steps of:
(i) Mixing the organic semiconductor composition according to the present invention with a solvent to form a semiconductor layer formulation;
(ii) Depositing said formulation onto a substrate; and
(iii) Optionally removing the solvent to form an organic semiconductor layer.

Useful substrate materials include, but are not limited to, polymeric films such as polyamides, polycarbonates, polyimides, polyketones, polyethylene terephthalate (PET) and polyethylene naphthalate (PEN), and inorganic substrates such as silica, alumina, silicon wafers and glass. The surface of a given substrate may be treated, e.g. by reaction of chemical functionality inherent to the surface with chemical reagents such as silanes or exposure of the surface to plasma, in order to alter the surface characteristics.

Prior to depositing the organic semiconductor composition onto the substrate, the composition may be combined with one or more solvents in order to facilitate the deposition step. Suitable solvents include any solvent which is able to dissolve both the organic binder and the polyacene compound, and which upon evaporation from the solution blend, give a coherent, defect-free layer. Suitable solvents for the organic binder and/or polyacene compound can be determined by preparing a contour diagram for the material as described in ASTM Method D 3132 at the concentration at which the mixture will be employed. The material is added to a wide variety of solvents as described in the ASTM method.

Suitable solvents include, but are not limited to, tetrahydrofuran, anisole, morpholine, toluene, o-xylene, m-xylene, p-xylene, 1,4-dioxane, acetone, methylethylketone, ethyl acetate, n-butyl acetate, dimethylformamide, dimethylacetamide, dimethylsulfoxide, tetralin, decalin and/or mixtures thereof. Preferably, no chlorinated solvents are used.

The proportions of organic binder to polyacene compound in the semiconductor layer formulation according to the present invention are typically 20:1 to 1:20 by weight, preferably 10:1 to 1:10, more preferably 5:1 to 1:5, still more preferably 3:1 to 1:3, further preferably 2:1 to 1:2 and especially 1:1.

In accordance with the present invention it has further been found that the level of the solids content in the organic semiconducting layer formulation is also a factor in achieving improved mobility values for electronic devices such as OFETs. The solids content of the formulation is commonly expressed as follows:

$$\text{Solids content (\%)} = \frac{a+b}{a+b+c} \times 100$$

wherein: a=mass of polyacene, b=mass of binder and c=mass of solvent.

The solids content of the formulation is preferably 0.1 to 10% by weight, more preferably 0.5 to 5% by weight.

Suitable conventional deposition methods include, but are not limited to, spin coating, knife-coating, roll-to-roll web-coating, and dip coating, as well as printing processes such as ink-jet printing, screen printing, and offset lithography. In one desired embodiment, the resulting composition is a printable composition, even more desirably, an ink jet printable composition.

Once the composition is deposited onto a substrate surface, the solvent may be removed to form an organic semiconductor layer. Any suitable method may be used to remove the solvent. For example, the solvent may be removed by evaporation or drying. Typically, at least about 80 percent of the solvent is removed to form the semiconductor layer. For example, at least about 85 weight percent, at least about 90 weight percent, at least about 92 weight percent, at least about 95 weight percent, at least about 97 weight percent, at least about 98 weight percent, at least about 99 weight percent, or at least about 99.5 weight percent of the solvent is removed.

The solvent often can be evaporated at any suitable temperature. In some methods, the solvent mixture is evaporated at ambient temperature. In other methods, the solvent is evaporated at a temperature higher or lower than ambient temperature. For example, a platen supporting the substrate can be heated or cooled to a temperature higher or lower than ambient temperature. In still other preferred methods, some or most of the solvent can be evaporated at ambient temperature, and any remaining solvent can be evaporated at a temperature higher than ambient temperature. In methods where the solvent evaporates at a temperature higher than ambient temperature, the evaporation can be carried out under an inert atmosphere, such as a nitrogen atmosphere.

Alternatively, the solvent can be removed by application of reduced pressure (i.e., at a pressure that is less than atmospheric pressure) such as through the use of a vacuum. During application of reduced pressure, the solvent can be removed at any suitable temperature such as those described above.

The rate of removal of the solvent can affect the resulting semiconductor layer. For example, if the removal process is too rapid, poor pi-pi crystal stacking of the semiconductor molecules can occur during crystallisation. Poor packing of the semiconductor molecules can be detrimental to the electrical performance of the semiconductor layer. The solvent can evaporate entirely on its own in an uncontrolled fashion (i.e. no time constraints), or the conditions can be controlled in order to control the rate of evaporation. In order to minimise poor molecule packing, the solvent can be evaporated while slowing the evaporation rate by covering the deposited layer. Such conditions can lead to a semiconductor layer having a relatively high crystallinity.

After removal of a desired amount of solvent to form the semiconductor layer, the semiconductor layer can be annealed by exposure to heat or solvent vapours, i.e., by thermal annealing or solvent annealing.

The organic semiconductor layer according to the present invention preferably has a charge mobility value of at least 0.5 $cm^2V^{-1}s^{-1}$, preferably between 0.5 and 8.0 $cm^2V^{-1}s^{-1}$, more preferably between 0.5 and 6.0 $cm^2V^{-1}s^{-1}$, more preferably between 0.8 and 5.0 $cm^2V^{-1}s^{-1}$, more preferably between 1 and 5.0 $cm^2V^{-1}s^{-1}$, more preferably between 1.5 and 5.0 $cm^2V^{-1}$, more preferably between 2 and 5.0 $cm^2V^{-1}s^{-1}$. The charge mobility value of the semiconductor layer can be measured using any standard method known to those skilled in the art, such as techniques disclosed in *J. Appl. Phys.*, 1994, Volume 75, page 7954 and WO 2005/055248, preferably by those described in WO 2005/055248.

Preferably, the organic semiconductor layer(s) of the present invention are semiconducting layers having a permittivity at 1000 Hz of between 3.4 and 8. In a preferred embodiment, the layer(s) have a permittivity at 1000 Hz of between 4.0 and 7, more preferably between 4.0 and 6.5, and even more preferably between 3.4 and 4.5.

Preferably, the organic semiconductor layer(s) according to the present invention has an electrical conductivity in the range of $10^3$ to $10^{-8}$ siemens per centimetre, preferably between 500 to $10^{-7}$, more preferably between 300 to $10^{-6}$, more preferably between 250 to $10^{-5}$, more preferably between 10 to $10^{-5}$ siemens per centimetre, more preferably greater than $10^{-4}$ or $10^{-3}$ siemens per centimetre.

Electronic Devices

The invention additionally provides an electronic device comprising the organic semiconductor composition according to the present invention. The composition may be used, for example, in the form of a semiconducting layer or film. Additionally, the invention preferably provides an electronic device comprising the organic semiconductor layer according to the present invention.

The thickness of the layer or film may be between 0.05 and 20 microns, preferably between 0.05 and 10 microns, between 0.05 and 5 microns and between 0.1 and 2 microns.

The electronic device may include, without limitation, organic field effect transistors (OFETS), organic light emitting diodes (OLEDS), photodetectors, organic photovoltaic (OPV) cells, sensors, lasers, memory elements and logic circuits.

Exemplary electronic devices of the present invention may be fabricated by solution deposition of the above-described organic semiconductor composition onto a substrate.

Figure 1:
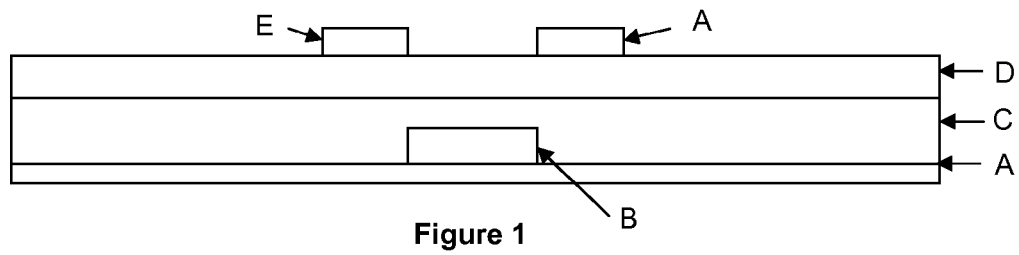
FIG. 1 is a representation of top contact/bottom gate
Figure 2:
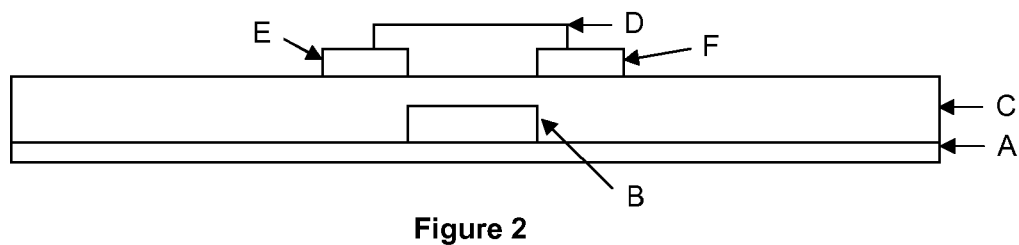
FIG. 2 is a representation of bottom contact/bottom gate
Figure 3:
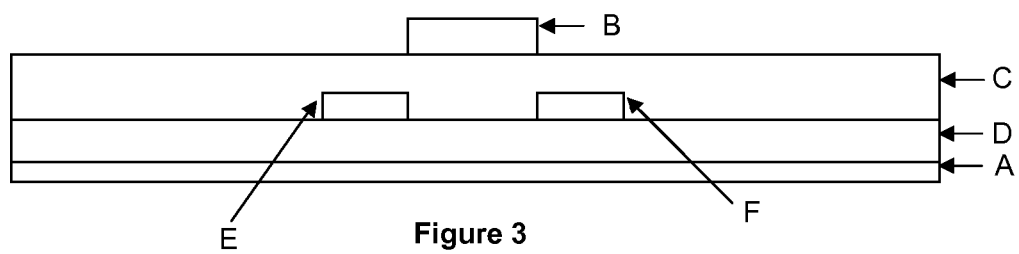
FIG. 3 is a representation of top contact/top gate
Figure 4:
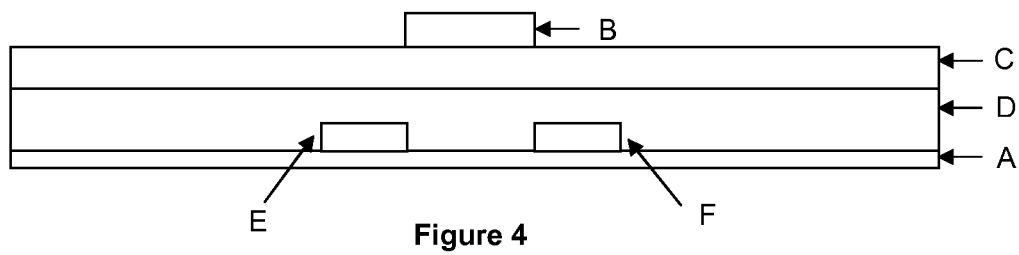
FIG. 4 is a representation of bottom contact/top gate

Labels—A: Substrate; B: Gate electrode; C: Dielectric layer; D: Semiconductor layer; E: Source electrode; F: Gate electrode

DETAILED DESCRIPTION OF THE INVENTION

General

The term "about" in relation to a numerical value x means, for example, x+10%.

The word "substantially" does not exclude "completely" e.g. a composition which is "substantially free" from Y may be completely free from Y. Where necessary, the word "substantially" may be omitted from the definition of the invention.

"Molecular weight" of a polymeric material (including monomeric or macromeric materials), as used herein, refers to the number-average molecular weight unless otherwise specifically noted or unless testing conditions indicate otherwise.

A "polymer" means a material formed by polymerising and/or crosslinking one or more monomers, macromers and/or oligomers and having two or more repeat units.

A "semiconducting binder" as used herein refers to an organic binder that is between a conductor and an insulator in its ability to conduct electrical current. Preferably, according to the present invention, a semiconducting material, composition or layer is one which has an electrical conductivity in the range of $10^3$ to $10^{-8}$ siemens per centimetre, more preferably between 500 to $10^{-7}$, more preferably between 300 to $10^{-6}$, more preferably between 250 to $10^{-5}$, more preferably between 10 to $10^{-5}$ siemens per centimetre, more preferably greater than $10^{-4}$ or $10^{-3}$ siemens per centimetre. The conductivity of the material or composition is measured according to ASTM D4308-10. The same test may be used to measure the conductivity of the compositions, layers and polyacene compounds of the present invention.

As used herein, the term "alkyl" group refers to a straight or branched saturated monovalent hydrocarbon radical, having the number of carbon atoms as indicated. By way of non limiting example, suitable alkyl groups include, methyl, ethyl, propyl, n-butyl, t-butyl, iso-butyl and dodecanyl.

As used herein, the term "alkoxy" group include without limitation, methoxy, ethoxy, 2-methoxyethoxy, t-butoxy, etc.

As used herein, the term "amino" group includes, without limitation, dimethylamino, methylamino, methylphenylamino, phenylamino, etc.

The term "carbyl" refers to any monovalent or multivalent organic radical moiety which comprises at least one carbon atom other without any non-carbon atoms (—C≡C), or optionally combined with at least one non-carbon atoms such as N, O, S, P, Sl, Se, As, Te or Ge (for example carbonyl etc.).

The term "hydrocarbon" group denotes a carbyl group that additionally contains one or more H atoms and optionally contains one or more hetero atoms.

A carbyl or hydrocarbyl group comprising 3 or more carbon atoms may be linear, branched and/or cyclic, including spiro and/or fused rings.

Preferred carbyl or hydrocarbyl groups include alkyl, alkoxy, alkylcarbonyl, alkylcarbonyloxy, alkoxycarbonyloxy, each of which is optionally substituted and has 1 to 40, preferably 1 to 18 carbon atoms, furthermore optionally substituted aryl, aryl derivative or aryloxy having 6 to 40, preferably 6 to 18 carbon atoms, furthermore alkylaryloxy, arylcarbonyl, aryloxycarbonyl, arylcarbonyloxy and aryloxycarbonyloxy, each or which is optionally substituted and has 7 to 40, more preferable 7 to 25 carbon atoms.

The carbyl or hydrocarbyl group may be saturated or unsaturated acyclic group, or a saturated or unsaturated cyclic group. Unsaturated acyclic or cyclic groups are preferred, especially alkenyl and alkynyl groups (especially ethynyl).

In the polyacenes of the present invention, the optional substituents on the said $C_1$-$C_{40}$ carbyl or hydrocarbyl groups for $R_1$-$R_{14}$ etc. preferably are selected from: silyl, sulpho, sulphonyl, formyl, amino, imino, nitrilo, mercapto, cyano, nitro, halo, $C_{1-4}$ alkyl, $C_{6-12}$ aryl, $C_{1-4}$ alkoxy, hydroxy and/or all chemically possible combinations thereof. More preferable among these optional substituents are silyl and $C_{6-12}$ aryl and most preferable is silyl.

"Substituted alkyl group" refers to an alkyl group having one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

"Alkenyl group" refers to a monovalent group that is a radical of an alkene, which is a hydrocarbon with at least one carbon-carbon double bond. The alkenyl can be linear, branched, cyclic, or combinations thereof and typically contains 2 to 30 carbon atoms. In some embodiments, the alkenyl contains 2 to 20, 2 to 14, 2 to 10, 4 to 10, 4 to 8, 2 to 8, 2 to 6, or 2 to 4 carbon atoms. Exemplary alkenyl groups include, but are not limited to, ethenyl, propenyl, and butenyl.

"Substituted alkenyl group" refers to an alkenyl group having (i) one or more C—C double bonds, and (ii) one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

"Alkynyl group" refers to a monovalent group that is a radical of an alkyne, a hydrocarbon with at least one carbon-carbon triple bond. The alkynyl can be linear, branched, cyclic, or combinations thereof and typically contains 2 to 30 carbon atoms. In some embodiments, the alkynyl contains 2 to 20, 2 to 14, 2 to 10, 4 to 10, 4 to 8, 2 to 8, 2 to 6, or 2 to 4 carbon atoms. Exemplary alkynyl groups include, but are not limited to, ethynyl, propynyl, and butynyl.

"Substituted alkynyl group" refers to an alkynyl group having (i) one or more C—C triple bonds, and (ii) one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group or a silyl group).

"Cycloalkyl group" refers to a monovalent group that is a radical of a ring structure consisting of 3 or more carbon atoms in the ring structure (i.e., only carbon atoms in the ring structure and one of the carbon atoms of the ring structure is the radical).

"Substituted cycloalkyl group" refers to a cycloalkyl group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Cycloalkylalkylene group" refers to a monovalent group that is a ring structure consisting of 3 or more carbon atoms in the ring structure (i.e., only carbon atoms in the ring), wherein the ring structure is attached to an acyclic alkyl group (typically, from 1 to 3 carbon atoms, more typically, 1 carbon atom) and one of the carbon atoms of the acyclic alkyl group is the radical. "Substituted cycloalkylalkylene group" refers to a cycloalkylalkylene group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Aryl group" refers to a monovalent group that is a radical of an aromatic carbocyclic compound. The aryl can have one aromatic ring or can include up to 5 carbocyclic ring structures that are connected to or fused to the aromatic ring. The other ring structures can be aromatic, non-aromatic, or combinations thereof. Examples of preferred aryl groups include, but are not limited to, phenyl, 2-tolyl, 3-tolyl, 4-tolyl, biphenyl, 4-phenoxyphenyl, 4-fluorophenyl, 3-carbomethoxyphenyl, 4-carbomethoxyphenyl, terphenyl, anthryl, naphthyl, acenaphthyl, anthraquinonyl, phenanthryl, anthracenyl, pyrenyl, perylenyl, and fluorenyl.

"Substituted aryl group" refers to an aryl group having one or more substituents on the ring structure, wherein each of the one or more substituents comprises a monovalent moiety containing one or more atoms (e.g., a halogen such as F, an alkyl group, a cyano group, a hydroxyl group, or a carboxylic acid group).

"Arylalkylene group" refers to a monovalent group that is an aromatic ring structure consisting of 6 to 10 carbon atoms in the ring structure (i.e., only carbon atoms in the ring structure), wherein the aromatic ring structure is attached to an acyclic alkyl group having one or more carbon atoms (typically, from 1 to 3 carbon atoms, more typically, 1 carbon atom) and one of the carbons of the acyclic alkyl group is the radical.

"Substituted arylalkylene group" refers to an arylalkylene group having one or more substituents thereon, wherein each of the one or more substituents comprises a monovalent moiety containing one or more atoms (e.g., a halogen such as F, an alkyl group, a cyano group, a hydroxyl group, or a carboxylic acid group).

"Acetyl group" refers to a monovalent radical having the formula —C(O)CH$_3$.

"Heterocyclic ring" refers to a saturated, partially saturated, or unsaturated ring structure comprising at least one of O, N, S and Se in the ring structure.

"Substituted heterocyclic ring" refers to a heterocyclic ring having one or more substituents bonded to one or more members of the ring structure, wherein each of the one or more substituents comprises a monovalent moiety containing one or more atoms (e.g., a halogen such as F, an alkyl group, a cyano group, a hydroxyl group, or a carboxylic acid group).

"Carbocyclic ring" refers to a saturated, partially saturated, or unsaturated ring structure comprising only carbon in the ring structure.

"Substituted carbocyclic ring" refers to a carbocyclic ring having one or more substituents bonded to one or more members of the ring structure, wherein each of the one or more substituents comprises a monovalent moiety containing one or more atoms (e.g., a halogen such as F, an alkyl group, a cyano group, a hydroxyl group, or a carboxylic acid group).

"Ether group" refers to a —$R_a$—O—$R_b$ radical wherein $R_a$ is a branched or unbranched alkylene, arylene, alkylarylene or arylalkylene hydrocarbon and $R_b$ is a branched or unbranched alkyl, aryl, alkylaryl or arylalkyl hydrocarbon.

"Substituted ether group" refers to an ether group having one or more substituents thereon, wherein each of the one or more substituents comprises a monovalent moiety containing one or more atoms other than carbon and hydrogen either alone (e.g., a halogen such as F) or in combination with carbon (e.g., a cyano group) and/or hydrogen atoms (e.g., a hydroxyl group or a carboxylic acid group).

Unless otherwise defined, a "substituent" or "optional substituent" is preferably selected from the group consisting of halo (I, Br, Cl, F), CN, $NO_2$, $NH_2$, —COOH and OH.

EXAMPLES OF THE PRESENT INVENTION

The following examples of the present invention are merely exemplary and should not be viewed as limiting the scope of the invention.

Measurement of the Capacitance of the Polymer Binder

The polymer binder was diluted with tetralin in order to lower its viscosity and make it possible to obtain a film thickness of ~1 micron when spin coated for the spin speed range 1000-2000 rpm/s. The polymer binder solution was spin coated at 500 rpm for 10 seconds, followed by 1500 rpm for 30 seconds, onto ITO coated and cleaned 1×1 inch glass substrates.

To clean the ITO coated substrates they were submerged in a 3% solution of DECon 90 and put in an ultrasonic bath (water temperature >65° C.), washed with deionised water, submerged in deionised water and put in an ultrasonic bath (water temperature >65° C.), washed a further time with deionised water, submerged in isopropyl alcohol and then put in an ultrasonic bath (water temperature >65° C.), and then spin dried.

After deposition of the polymer binder the substrate was annealed on a hotplate at 120° C. for 5 minutes.

The substrate was then covered with a capacitance shadow mask, and top electrodes were deposited by evaporation of gold using a thermal deposition method. In order to determine the exact thickness of the polymer binder layer, the thickness was measured using a Dektak 3030 profilometer (available from Veeco, Plainview N.Y.) at three different positions and averaged; these values were subsequently used to calculate the dielectric constants of the polymer binders.

Capacitance measurements were then carried out using impedance analyser Agilent 43961A and a probe station. In order to improve the electrical contact between the ITO back electrode and the external probe electrode, a conductive silver paste was applied. The sample being measured was placed in a metal box on the metal plate to ensure minimum influence from the external environment.

Before each set of measurements was obtained, the analyser was calibrated using the 43961A Impedance Test Kit as a compensation routine was carried out to account for internal capacitance of the analyser and test fixture. The measurement calibration was carried out with open and shorted circuit; the dielectric constant was calculated using the following equation:

$$C = \in \times \in_o \times (A/d).$$

Wherein C is the capacitance (Farads), A is the area (m²), d is the coating thickness (m), $\in$ is the dielectric constant (permittivity), and $\in_o$ is the permittivity of free space and is taken as $8.8854 \times 10^{-12}$ F/m.

As a reference sample, a polystyrene sample (Mw~350,000) having a thickness of 1 μm was tested. The measured and calculated dielectric constant of the polystyrene reference was $\in$=2.55 at 10,000 Hz, which is in good agreement with the reported value ($\in$~2.5), refer to J. R. Wunsch, Polystyrene-Synthesis, Production and Applications, *Rapra Review Reports*, 2000, Volume 10, No. 4, page 32.

OTFT Fabrication Method

A substrate (either glass or a polymer substrate such as PEN) is patterned with Au source drain electrodes either by a process of thermal evaporation through a shadow mask or by photolithography (an adhesion layer of either Cr or Ti is deposited on the substrate prior to deposition of Au). The Au electrodes can then optionally be cleaned using an $O_2$ plasma cleaning process. A solution of organic semiconductor in binder is then applied by spin coating (the sample is flooded with the solution and the substrate is then spun at 500 rpm for 5 seconds then 1500 rpm for 1 minute). The coated substrate is then dried in air on a hot stage. The dielectric material, for example 3 wt % PTFE-AF 1600 (Sigma-Aldrich cat #469610) dissolved in FC-43 was then applied to the substrate by spin coating (sample flooded then spun at 500 rpm for 5 seconds then 1500 rpm for 30 seconds). The substrate was then dried in air on a hot stage (100° C. for 1 minute). A gate electrode (Au) is then defined over the channel area by evaporation through a shadow mask.

The mobility of the OTFT for the binders is characterised by placing on a manual probe station connected to a Keithley SCS 4200 semiconductor analyzer. The source drain voltage ($V_{DS}$) is set at −2V (linear) or −40V (saturation) and the gate voltage ($V_G$) scanned from +20V to −60V. Drain current is measured and mobility calculated from the transconductance.

The mobility of the OTFT for the formulations is characterised by placing on a semi-auto probe station connected to a Keithley SCS 4200 semiconductor analyzer. The source drain voltage ($V_{DS}$) is set at −2V and the gate voltage ($V_G$) scanned from +20V to −40V. Drain current is measured and mobility calculated from the transconductance.

In linear regime, when $|V_G|>|V_{DS}|$, the source-drain current varies linearly with $V_G$. Thus the field effect mobility (μ) can be calculated from the gradient (S) of $I_{DS}$ vs. $V_G$ given by equation 1 (where $C_i$ is the capacitance per unit area, W is the channel width and L is the channel length):

$$S = \frac{\mu W C_i V_{DS}}{L} \qquad \text{Equation 1}$$

In the saturation regime, the mobility is determined by finding the slope of $I_{DS}^{1/2}$ vs. $V_G$ and solving for the mobility (Equation 2)

$$I_{DS} = \frac{W C_i \mu (V_{GS} - V_T)^2}{2L} \qquad \text{Equation 2}$$

Method to Determine Molecular Weight and Molecular Weight Distribution

Gel Permeation Chromatography (GPC) analysis was carried out on a Waters Alliance 2695 instrument along with a Waters 2414 refractive index (RI) detector, using an Agilent PL gel 5 μm Mixed-D 300×7.5 mm column eluting with tetrahydrofuran. Calibration was performed using Agilent "EasiVial" polystyrene standards (PL2010-0400)

Examples

1. Preparation of bis(N-4-chlorophenyl)-2-methoxyphenylamine (Compound 1)

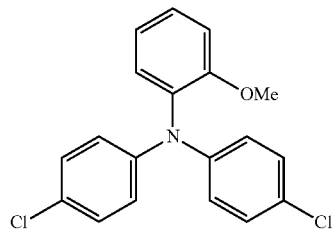

Compound 1

A mixture of 2-methoxyaniline (Sigma-Aldrich A88182, 20.0 g, 162 mmol, 1 equiv), 1-chloro-4-iodobenzene (96.8 g, 406 mmol, 2.5 equiv), copper powder (31.0 g, 488 mmol, 3.0 equiv), potassium carbonate (80.8 g, 585 mmol, 3.6 equiv), 18-crown-6 (10.7 g, 0.25 equiv, 40.6 mmol) and o-dichlorobenzene (40 mL) were charged to a nitrogen purged 500 mL round bottom flask fitted with a Dean-Stark apparatus (including a condenser) and a thermometer. The reaction mixture was heated to 190° C. with stirring. The reaction was monitored by thin-layer chromatography (consumption of the aniline/appearance of product). When the reaction as complete (48 hrs), the mixture was allowed to cool to room temperature. The mixture was then filtered through a Whatman GF/F filter to remove inorganic solids. The filter cake was washed with dichloromethane (200 mL). The filtrate was then added to a separating funnel containing water (100 mL). The mixture was then agitated and the organic and aqueous layers separated. The organic layer was died over MgSO$_4$, filtered and concentrated to give a dark brown viscous oil. The mixture was then purified by flash column chromatography (gradient elution: 20%-50% dichloromethane in heptane) to give an off-white solid. Recrystallisation from methanol gave the product as a colourless solid (25.1 g, 73.0 mmol, 45%). $^1$H NMR (500 MHz, CDCl$_3$) 7.37-7.00 (12H, m, aromatic), 3.79 (3H, s, OCH$_3$).

2. Preparation of High Molecular Weight Binder (Oligomer 1)

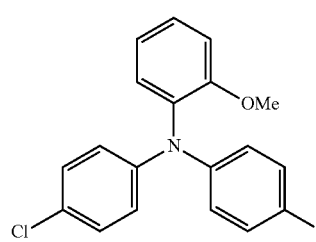 

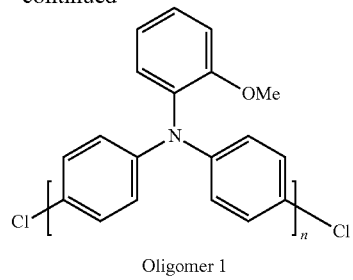

Oligomer 1

A flame dried 500 mL round-bottom flask fitted with a condenser, thermometer and nitrogen inlet was charged with nickel (II) chloride (0.20 g, 1.54 mmol), zinc powder (10.80 g, 165 mmol), 2,2'-bipyridyl (0.35 g, 2.24 mmol), triphenylphosphine (7.80 g, 29.7 mmol) and anhydrous N,N-dimethylacetamide (200 mL). The mixture was heated to 70° C., at which point the reaction mixture becomes dark brown/red in colour (characteristic of the formation of a nickel (0) species). The mixture was stirred at 70° C. for a further 30 minutes. Bis(N-4-chlorophenyl)-2-methoxyphenylamine (Compound 1, 20.0 g, 58.1 mmol) was then added in a single charge. After approx. 90 minutes solid material began to precipitate from the reaction mixture. Toluene (70 mL) and another charge of nickel (II) chloride (0.2 g, 1.54 mmol) were added and the reaction mixture was stirred at 70° C. overnight. The reaction mixture was allowed to cool and was then filtered through a Whatman Grade 1 filter paper. The filtered solid was then dissolved in toluene (100 mL). Concentrated hydrochloric acid was then added dropwise to destroy excess zinc. The phases were then separated and the organic phase concentrated to give a pale yellow semisolid. This was dissolved in THF (100 mL) and poured into MeOH (100 mL). The precipitated solid was collected by filtration and dried (16.1 g, $n_{av}$=35, $M_n$=9555).

2.1 Purification

The solid obtained above was purified by column chromatography (Silica gel 60; eluent 50% dichloromethane in heptane). The columned fractions were then concentrated, dissolved in THF (60 mL) and poured into MeOH (150 mL). The precipitated solid was collected by filtration and dried (14.0 g, $n_{av}$=42, $M_n$=11466). The chromatography/precipitation was repeated two more times (13.5 g, $n_{av}$=48, $M_n$=13104).

2.2 Reduction (Oligomer 2)

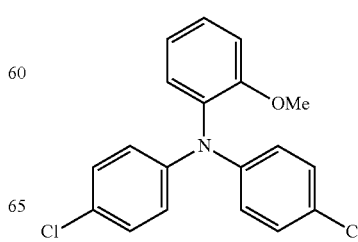 

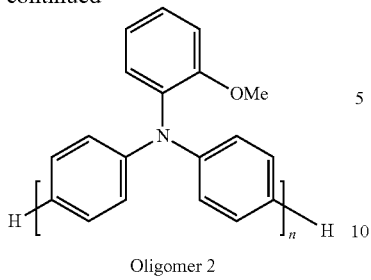

Oligomer 2

Ammonium formate (45.0 g), Pd/C (10% Pd, 14.0 g) and water (60 mL) were charged to a 500 mL round bottom flask. Oligomer 1 in toluene (120 mL) was then added and the mixture was heated gradually to 85° C. for 8 hours. The mixture was allowed to cool to room temperature overnight. More ammonium formate (20.0 g) and Pd/C (7.0 g) were added and the mixture heated to 85° C. for 8 hours. The mixture was then allowed to cool to room temperature overnight. The catalyst was then removed by filtration through a plug of Celite. The organic layer was separated, dried over MgSO$_4$, filtered and concentrated. The mixture was then purified by sequential column chromatography (Silica gel 60, eluent 50% dichloromethane in heptane) and precipitation (dissolved in 60 mL THF, poured into 150 mL MeOH and filtered) three times. The final solid was dried (12.8 g, n$_{av}$=48, M$_n$=13104).

3. Preparation of low molecular weight binder (Oligomer 3)

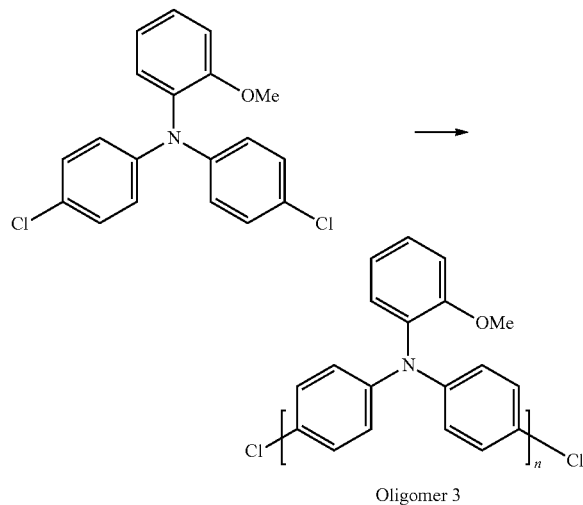

Oligomer 3

A flame dried 500 mL round-bottom flask fitted with a condenser, thermometer and nitrogen inlet was charged with nickel (II) chloride (0.20 g, 1.54 mmol), zinc powder (10.80 g, 165 mmol), 2,2'-bipyridyl (0.35 g, 2.24 mmol), triphenylphosphine (7.80 g, 29.7 mmol) and anhydrous N,N-dimethylacetamide (150 mL). The mixture was heated to 70° C., at which point the reaction mixture becomes dark brown/red in colour (characteristic of the formation of a nickel (0) species). The mixture was stirred at 70° C. for a further 30 minutes. Bis(N-4-chlorophenyl)-2-methoxyphenylamine (Compound 1, 20.0 g, 58.1 mmol) was then added in a single charge. After 2 hours toluene (200 mL) was added and the reaction was cooled to room temperature. Concentrated hydrochloric acid as added dropwise to destroy excess zinc. The organic layer was separated and the solvent removed in vacuo. The crude oil obtained was then dissolved in THF (60 mL) and was poured into MeOH (150 mL). The precipitated solid was collected by filtration and dried (15.5 g, n$_{av}$=11, M$_n$=3003). The material was then purified as described below.

3.1 Purification

The solid obtained above was purified by column chromatography (Silica gel 60; eluent 50% dichloromethane in heptane). The columned fractions were then concentrated, dissolved in THF (60 mL) and poured into MeOH (150 mL). The precipitated solid was collected by filtration and dried (12.4 g, n$_{av}$=14). The chromatography/precipitation was repeated two more times (11.5 g, n$_{av}$=14, M$_n$=3822).

Oligomer 3 had a permittivity of 3.5 Fm$^{-1}$ at 1000 Hz.
Formulation 1

Oligomer 3 and polyacene 1, (1,4,8,11-tetramethyl-6,13-bis(triethylsilylethynyl) pentacene) (1:1 ratio by weight) were dissolved in 1,2,3,4-tetrahydronaphthalene at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s then 1500 rpm for 20 s). Finally an Au gate electrode was deposited by shadow mask evaporation.

Mobility was 2.5 cm$^2$V$^2$V$^{-1}$s$^{-1}$ (linear mobility, channel length L=30 µm).

3.2 Reduction (Oligomer 4)

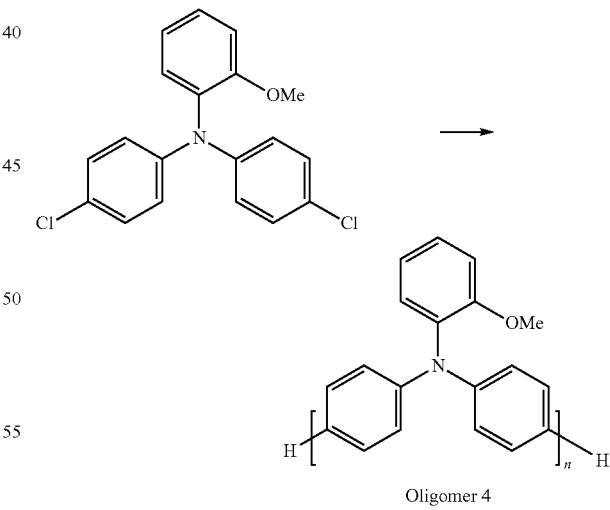

Oligomer 4

Ammonium formate (45.0 g), Pd/C (10% Pd, 14.0 g) and water (60 mL) were charged to a 500 mL round bottom flask. Oligomer 4 in toluene (120 mL) was then added and the mixture was heated gradually to 85° C. for 8 hours. The mixture was allowed to cool to room temperature overnight. More ammonium formate (20.0 g) and Pd/C (7.0 g) were added and the mixture heated to 85° C. for 8 hours. The mixture was then allowed to cool to room temperature overnight. The catalyst was then removed by filtration through a plug of Celite. The organic layer was separated, dried over MgSO₄, filtered and concentrated. The mixture was then purified by sequential column chromatography (Silica gel 60, eluent 50% dichloromethane in heptane) and precipitation (dissolved in 60 mL THF, poured into 150 mL MeOH and filtered) three times. The final solid was dried (10.2 g, $n_{av}$=14, $M_n$=3822).

4. Preparation of 2-Methoxy polytriarylamine oligomer by polymerising 2-methoxy aniline with 4,4'-dibromobiphenyl (Oligomer 5)

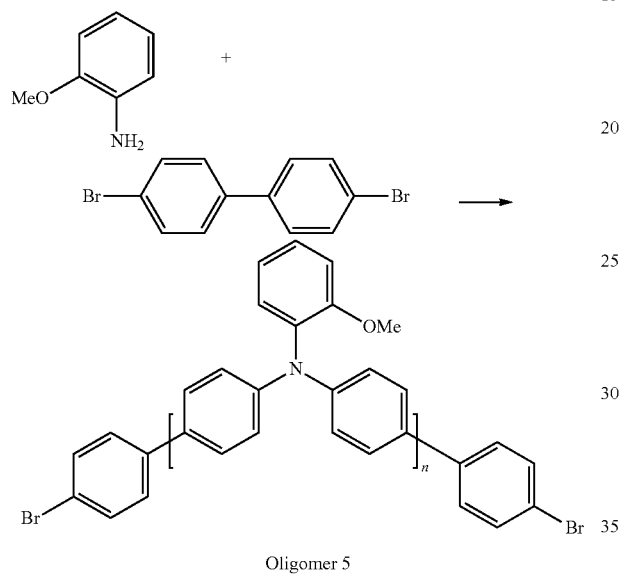

Oligomer 5

A mixture of 2-methoxyaniline (Sigma-Aldrich A88182, 1.54 g, 12.5 mmol), 4,4'-biphenyl (Sigma-Aldrich 229237, 7.80 g, 25 mmol, 2 eq.) sodium tert-butoxide (NaO$^t$Bu) (5.05 g, 105 mmol) in toluene (50 mL) was degassed by passing a stream of nitrogen through the solution for 15 minutes. Pd₂dba₃ (Sigma-Aldrich 328774, 0.06 g, 0.15 mol %) and P(tBu)₂-o-biphenyl (Sigma-Aldrich 638439, 0.07 g, 0.65 mol %) were then added and the mixture heated to 85 deg C. After approx. 1 hour HPLC confirmed the presence of oligomers. A further charge of 2-methoxyaniline (3.08 g, 25.0 mmol) and NaO$^t$Bu (5.05 g, 105 mmol) were added. After another 2 hours 4,4'-biphenyl (7.80 g), Pd₂dba₃ (0.06 g) and P(tBu)₂-o-biphenyl (0.07 g) were added and the mixture stirred at 85 deg C. overnight. After a total reaction time of 21 hours the mixture was allowed to cool to room temperature. The mixture was poured into water (150 mL) and filtered through a GF/A filter and the cake washed with THF (50 mL). The organic layer of the filtrate was separated and the aqueous layer was extracted with THF (3×30 mL). The organic layers were combined, dried (MgSO₄), filtered and concentrated to give a brown semi-solid (15.37 g). The crude product was dissolved in THF (50 mL) and added dropwise into methanol (100 mL). The precipitated solid was collected by filtration under suction using a Buchner funnel, washed with methanol (20 mL) and pulled dry (12.3 g). The solid was purified by dry column chromatography eluting with dichloromethane. The fractions containing product were concentrated (11.7 g), the product dissolved in THF (50 mL) and added dropwise into methanol (100 mL). The precipitated solid was collected by filtration using a Buchner funnel and was then dried in a vacuum oven (40 deg C.) overnight to give the product as a pale yellow amorphous solid (9.35 g) which was characterised as follows: GPC: Mn=2036 Daltons, $N_{av}$=7.

Oligomer 5 had a permittivity of 3.4 Fm⁻¹ at 1000 Hz; a mobility of 6.3×10⁻⁶ cm²V⁻¹s⁻¹ (linear mobility) and 2.4× 10⁻⁵ cm²V⁻¹s⁻¹ (saturation mobility) at a channel length, L=40 μm.

4.1: Preparation of 4-Methoxy polytriarylamine oligomer (2) by polymerising 4-methoxy aniline with 4,4'-dibromobiphenyl (Oligomer 6)

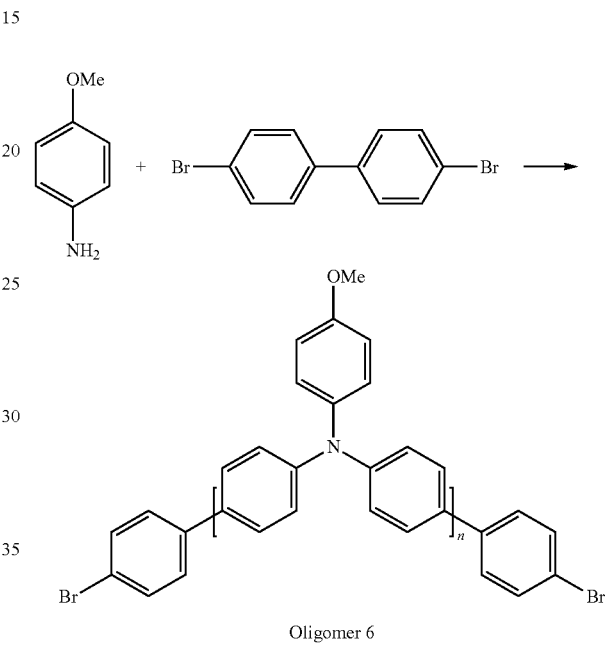

Oligomer 6

A mixture of 4-methoxyaniline (Sigma-Aldrich A88255, 3.08 g, 25.0 mmol), 4,4'-biphenyl (15.60 g, 50 mmol, 2 eq.) sodium tert-butoxide (10.10 g, 105 mmol) in toluene (50 mL) was degassed by passing a stream of nitrogen through the solution for 15 minutes. Pd₂dba₃ (0.12 g, 0.3 mol %) and P(tBu)₂-o-biphenyl (0.14 g, 1.3 mol %) were then added and the mixture heated to 85 deg C. After approx. 1 hour, HPLC confirmed the presence of oligomers. A further charge of 4-methoxyaniline (6.16 g, 50.0 mmol) and NaO$^t$Bu (10.10 g, 105 mmol) were then added. After a further 2 hours, 4,4'-biphenyl (15.6 g), Pd₂dba₃ (0.12 g) and P(tBu)₂-o-biphenyl (0.14 g) were added and the mixture stirred at 85 deg C. overnight. After a total reaction time of 18 hours the mixture was allowed to cool to room temperature. The mixture was then poured into water (~300 mL), filtered through a GF/A filter and the cake washed with THF (50 mL). The organic layer of the filtrate was separated and the aqueous layer was extracted with THF (3×30 mL). The organic layers were combined, dried (MgSO₄), filtered and concentrated to give a brown semi-solid (19.79 g). The crude product was dissolved in THF (50 mL) and added dropwise into methanol (100 mL). The precipitated solid was collected by filtration under suction using a Buchner funnel and washed with methanol (30 mL) (16.41 g). The solid was purified by dry column chromatography (eluent: dichloromethane/THF). The fractions containing product were concentrated (14.4 g), the product dissolved in THF (50 mL)

and added dropwise into methanol (100 mL). The precipitated solid was collected by filtration using a Buchner funnel. The material was purified using dry column chromatography, eluting with dichloromethane (DCM; 7.30 g). The product was then dissolved in THF (50 mL) and precipitated into methanol (100 mL). The solid was collected by filtration and was then dried in a vacuum oven (40 deg C.) overnight to give the product as a pale yellow amorphous solid (6.40 g) which was characterised as follows: GPC Mn=1307 Daltons, $N_{av}$=5.

Oligomer 6 had a permittivity of 3.5 $Fm^{-1}$ at 1000 Hz; a mobility of $4.2\times10^{-5}$ $cm^2V^{-1}s^{-1}$ (linear mobility) and $1.0\times10^{-4}$ $cm^2V^{-1}s^{-1}$ (saturation mobility) at a channel length, L=40 μm.

Formulation 2

Oligomer 6 and polyacene 1, (1,4,8,11-tetramethyl-6,13-bis(triethylsilylethynyl) pentacene) (1:1 ratio by weight) were dissolved in 1,2,3,4-tetrahydronaphthalene at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s then 1500 rpm for 20 s). Finally an Au gate electrode was deposited by shadow mask evaporation. Mobility was 4.00 $cm^2V^{-1}s^{-1}$ (linear mobility, channel length L=30 μm).

6. Reduction of the 4-Methoxy polytriarylamine oligomer to afford Oligomer 7

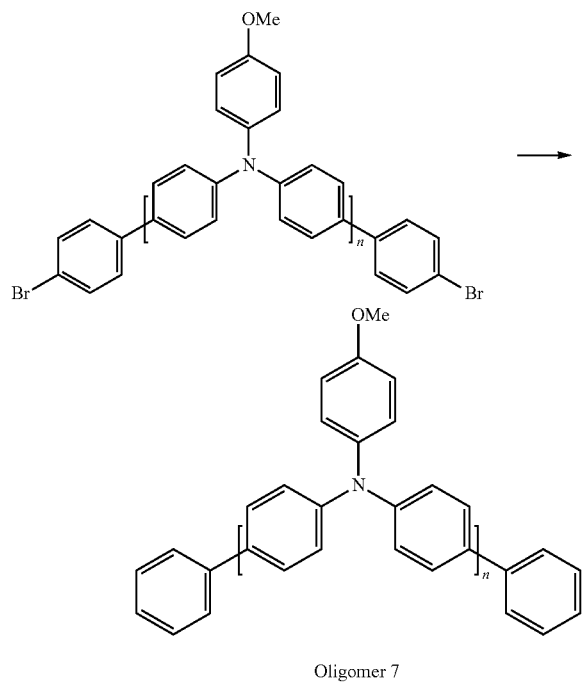

Oligomer 7

4-methoxy polymer (Oligomer 6, 2.50 g) was dissolved in toluene (20 mL) in a three-necked flask fitted with a condenser. Ammonium formate (10.0 g, 159 mmol) and Pd on activated carbon (10% Pd, 2.5 g) were added and the mixture heated to 65 deg C. After 14 hours a further charge of ammonium formate (10.0 g, 159 mmol) and Pd on activated carbon were added and the mixture stirred at 65 deg C. for a further 6 hours. The mixture was allowed to cool, water (20 mL) was added and the organic layer separated. The organic layer was dried over $MgSO_4$, filtered and concentrated to give a cream coloured semi-solid (2.31 g). The solid was dissolved in THF (30 mL) and the oligomer precipitated by pouring slowly into methanol (60 mL) with stirring. The precipitated solid was collected by filtration. The solid was then purified by dry column chromatography (eluent 1:1 DCM: THF) three times. The mixture as then dissolved in THF (30 mL) and precipitated into methanol (60 mL) and collected by filtration. (2.20 g), which was characterised as follows: GPC Mn=1313 Daltons, $N_{av}$=5.

Oligomer 7 had a permittivity of 3.5 $Fm^{-1}$ at 1000 Hz.

Formulation 3

Oligomer 7 and polyacene 1 (1,4,8,11-tetramethyl-6,13-bis(triethylsilylethynyl) pentacene) (1:1 ratio by weight) were dissolved in 1,2,3,4-tetrahydronaphthalene at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s, then 1500 rpm for 20 s). Finally an Au gate electrode was deposited by shadow mask evaporation.

Mobility was 4.5 $cm^2V^{-1}s^{-1}$ (linear mobility, channel length L=30 μm) and 4.1 $cm^2V^{-1}s^{-1}$ (linear mobility, channel length L=4 μm).

7. Preparation of bis(N-4-chlorophenyl)-4-methoxyphenylamine (Compound 2)

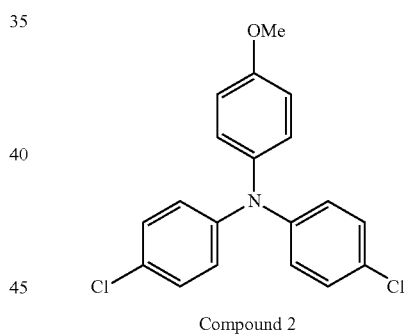

Compound 2

A mixture of 4-methoxyaniline (60.50 g, 491 mmol), 1-chloro-4-iodobenzene (292.87 g, 1228 mmol), anhydrous potassium carbonate (244.40 g, 1770 mmol), copper powder (93.66 g, 1474 mmol), 18-crown-6 ether (32.46 g, 123 mmol) and anhydrous ortho-dichlorobenzene (o-DCB, 100 mL), were charged to a 700 mL flange flask, fitted with a Dean-Stark trap, thermometer, overhead stirrer and water condenser, and flushed with nitrogen for 10 mins. The mixture was heated to 170 deg C. and stirred for. After 72 hours the mixture was allowed to cool to room temperature and was then filtered through a GF/A filter paper. The cake was washed with DCM (800 mL and the combined filtrates were washed with water (HPLC grade, 250 mL×2). The combined aqueous layers were back-extracted with DCM (200 mL×2), combine and dried over $MgSO_4$. The filter cake was washed with DCM (150 mL×2) and the combined filtrates concentrated in vacuo to give a brown semi-solid (227.12 g). The crude product was dissolved in heptane (200 mL) and purified by dry column chromatography (gradient elution: heptane-10% DCM: heptane) gave a pale yellow viscous oil, 101.87 g. $^1$H NMR (500 MHz, CDCl$_3$) 7.16 (4H, d, J=8.8 Hz), 7.02 (2H, d, J=8.8 Hz), 6.93 (4H, d, J=8.8 Hz), 6.84 (2H, d, J=8.8 Hz), 3.80 (3H, s, OC$\underline{H}_3$).

8. Preparation of 4-methoxy polytriarylamine Oligomer 8 by polymerising the amine monomer (as prepared in Example 2(c))

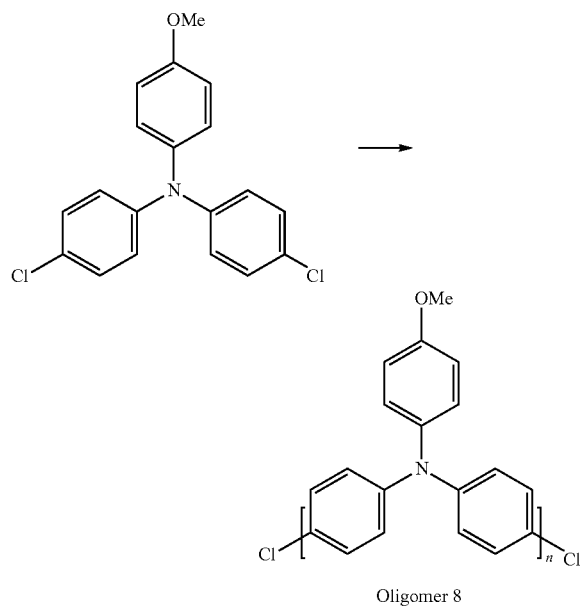

Oligomer 8

A 500 mL flange flask, fitted with a thermometer, overhead stirrer and water condenser, was flame-dried under nitrogen purge to 100 deg C., then allowed to cool to ambient temperature. Nickel(II) chloride (0.098 g, 0.76 mmol), zinc powder (5.92 g, 90.61 mmol), 2'-bipyridyl (0.18 g, 1.13 mmol), triphenylphosphine (3.94 g, 15.03 mmol) and anhydrous DMAc (90 mL) were charged in and the grey suspension stirred at 20 deg C. for 15 mins. The mixture was then heated to 70 deg C. The burgundy colour of the catalyst forms as the temperature increases. Stirring was continued at 70 deg C. for a further 20 mins to allow the catalyst to stabilise, then a solution of the 4-methoxy monomer (Example 2(c), 10 g) in anhydrous DMAc (10 mL) was added to the flange flask and stirring continued for 4.5 h. After 4 h, solids start to precipitate. The mixture was allowed to cool to 25 deg C. Toluene (210 mL) was added and the stirred mixture was then cooled in an ice/water bath to 15 deg C., then concentrated hydrochloric acid (37%, 35 mL) was added dropwise (exotherm to 30 deg C.). The mixture was stirred for 10 mins, filtered and the filtrate transferred to a separating funnel. The filter cake were stirred in THF (300 mL) and filtered. This filtrate was combined with the organic layer from the separating funnel and concentrated in vacuo to give a yellow semi-solid (20.33 g). The material was dissolved in THF (60 mL) then poured slowly into methanol (180 mL). The precipitated solid was isolated by filtration (6.33 g) and purified by dry column chromatography (eluent: THF). After the final column the solid obtained was dissolved in THF (20 mL) and poured slowly into methanol (60 mL), the precipitated solid was collected by filtration under suction using a Buchner funnel, washed with methanol and pulled dry. The solid was then dried in a vacuum oven to give the product as a yellow powder (5.42 g), which was characterised as follows: GPC Mn=2405 Daltons, N$_{av}$=9.

Oligomer 8 had a permittivity of 3.5 Fm$^{-1}$ at 1000 Hz; a mobility of 6.0×10$^{-5}$ cm$^2$V$^{-1}$s$^{-1}$ (linear mobility) and 4.5× 10$^{-4}$ cm$^2$V$^{-1}$s$^{-1}$ (saturation mobility) at a channel length, L=40 μm Formulation 4

Oligomer 8 and polyacene 1 (1,4,8,11-tetramethyl-6,13-bis(triethylsilylethynyl) pentacene) (1:1 ratio by weight) were dissolved in 1,2,3,4-tetrahydronaphthalene at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s, then 1500 rpm for 20 s). Finally an Au gate electrode was described by shadow mask evaporation.

Mobility was 2.6 cm$^2$V$^{-1}$s$^{-1}$ (linear mobility, channel length L=30 μm).

9. 4-Ethoxy polytriarylamine oligomer (Oligomer 9) Preparation of 4-Ethoxy polytriarylamine oligomer by polymerising 4-ethoxy aniline with 4,4'-dibromobiphenyl

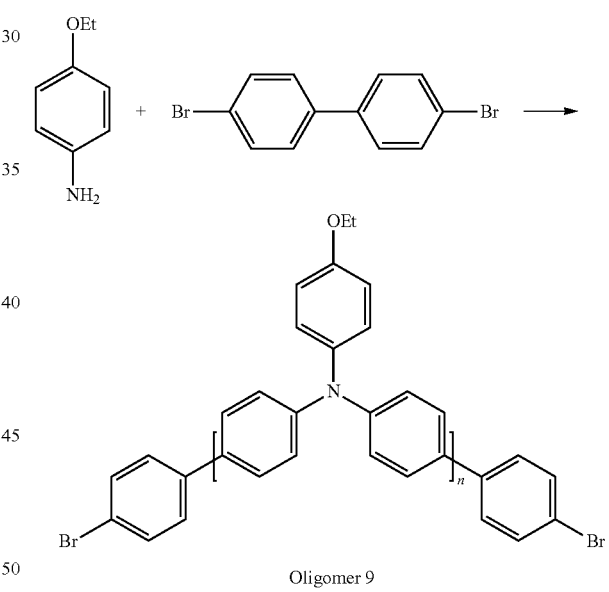

Oligomer 9

A mixture of 4-ethoxyaniline (Sigma-Aldrich P14815, 1.71 g, 12.5 mmol), 4,4'-biphenyl (7.80 g, 25.0 mmol) sodium tert-butoxide (5.05 g, 52.6 mmol) in toluene (50 mL) was degassed by passing a stream of nitrogen through the solution for 15 minutes. Pd$_2$dba$_3$ (0.06 g, 0.15 mol %) and P(tBu)$_2$-o-biphenyl (0.07 g, 0.65 mol %) were then added and the mixture heated to 85 deg C. After approx. 1 hour HPLC confirmed the presence of oligomers. Further amounts of 4-ethoxyaniline (3.42 g, 24.9 mmol) and NaO$^t$Bu (5.05 g, 52.6 mmol) were then added. After another 2 hours 4,4'-biphenyl (7.80 g, 25.0 mmol), Pd$_2$dba$_3$ (0.06 g, 0.15 mol %) and P(tBu)$_2$-o-biphenyl (0.07 g, 0.65 mol %) were added and the mixture stirred at 85 deg C. overnight. After a total reaction time of 20 hours the mixture was allowed to cool to room temperature. The mixture was then poured into water (~300 mL). The mixture was filtered through a GF/A filter and the cake washed with toluene (50 mL). The organic layer of the filtrate was separated and the aqueous extracted with toluene (3×30 mL). The organic layers were combined, dried over MgSO$_4$, filtered and concentrated to give a brown semisolid (18.20 g). The crude product was dissolved in THF (50 mL) and added dropwise into methanol (100 mL). The precipitated solid was collected by filtration under suction using a Buchner funnel and pulled dry (13.56 g). The solid was purified by dry column chromatography (eluent: dichloromethane). The fractions containing product were concentrated, the product (10.92 g) dissolved in THF (50 mL) and added dropwise into methanol (100 mL). The precipitated solid was collected by filtration (Whatman No. 1 paper). The solid was then dried in a vacuum oven (40 deg C.) overnight to give the product as a cream coloured amorphous solid (8.10 g), which was characterised as follows: GPC Mn=1539 Daltons, $N_{av}$=5.

Oligomer 9 had a permittivity of 3.7 Fm$^{-1}$ at 1000 Hz; a mobility of 6.2×10$^{-6}$ cm$^2$V$^{-1}$s$^{-1}$ (linear mobility) and 1.0× 10$^{-6}$ cm$^2$V$^{-1}$s$^{-1}$ (saturation mobility) at channel length, L=40=µm Formulation 5

Oligomer 9 and polyacene 1 (1,4,8,11-tetramethyl-6,13-bis(triethylsilylethynyl) pentacene) (1:1 ratio by weight) were dissolved in bromomesitylene at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s then 1500 rpm for 20 s). Finally an Au gate electrode was described by shadow mask evaporation.

Mobility was 3.1 cm$^2$V$^{-1}$s$^{-1}$ (linear mobility, channel length 100 µm).

10. Preparation of bis(N-4-chlorophenyl)-2,4-dimethoxyphenylamine (Compound 3)

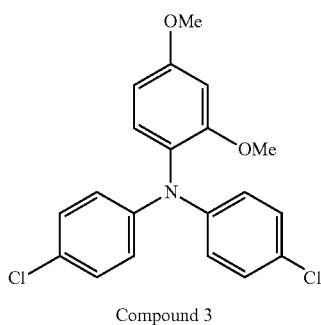 [SMILES: COc1ccc(N(c2ccc(Cl)cc2)c2ccc(Cl)cc2)c(OC)c1]

Compound 3

A mixture of 2,4-dimethoxyaniline (TCI Europe D1982, 60.00 g, 391 mmol), 1-chloro-4-iodobenzene (233.51 g, 979 mmol), anhydrous potassium carbonate (194.89 g, 1410 mmol), copper powder (71.48 g, 1.12 mmol). 22 g, 1089, 18-crown-6 ether (25.88 g, 97.9 mmol) and anhydrous o-DCB (100 mL) were charged to a 700 mL flange flask, fitted with a Dean-Stark trap, thermometer, overhead stirrer and water condenser, and flushed with nitrogen for 10 mins. The mixture was heated to between 170 deg C. After 3 hr the mixture was allowed to cool to room temperature, DCM (500 mL) was added and the mixture filtered through a GF/A filter paper. The cake washed with DCM (200 mL). The combined filtrates were washed with water (250 mL×2) and the combined aqueous layers back-extracted with DCM (200 mL×2). The organic layers were combined, dried over MgSO$_4$ (30 mins) and filtered. The filter cake was washed with further DCM (150 mL×2) and the combined filtrates concentrated in vacuo to give a brown semi-solid (181.11 g). The crude product was dry loaded onto silica gel and purified by dry flash column chromatography (gradient elution: heptanes-15% DCM:heptane) to give a colourless solid (72.95 g). The product was recystallised from heptane to give a colourless crystalline solid (62.89 g, 43%). $^1$H NMR (500 MHz) 7.13 (2H, d, J=8.8 Hz), 7.06 (2H, d, J=9.0 Hz), 6.89 (2H, d, J=8.8 Hz), 6.54 (1H, d, J=2.5 Hz), 6.49 (2H, m), 3.83 (3H, s), 3.65 (3H, s).

11. Preparation of 2,4-Dimethoxy polytriarylamine oligomer (10) by polymerising the amine monomer Compound 3

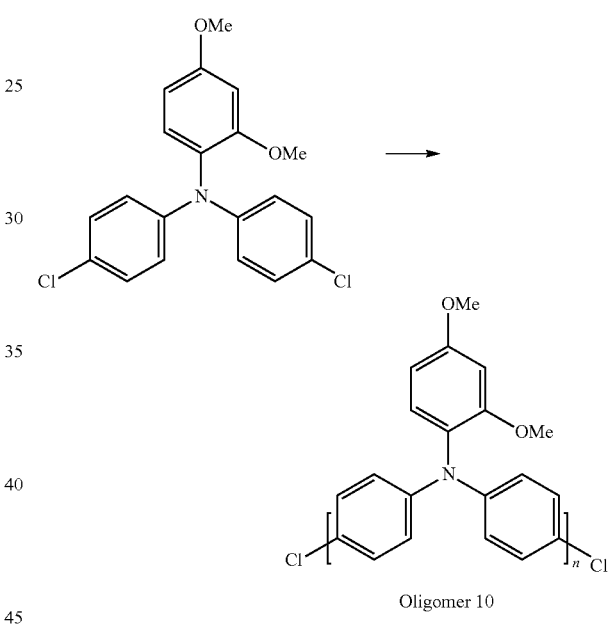

Oligomer 10

A 500 mL flange flask, fitted with a thermometer, overhead stirrer and water condenser, was flame-dried under nitrogen purge to 100 deg C., then allowed to cool to ambient temperature. Nickel(II) chloride (0.10 g, 0.76 mmol), zinc powder (5.91 g, 90.6 mmol), 2'-bipyridyl (0.18 g, 1.13 mmol), triphenylphosphine (3.93 g, 15.03 mmol) and anhydrous DMAc (90 mL) were charged and the grey suspension stirred at 20 deg C. for 15 mins. The mixture was then heated to 70 deg C., during which time the reaction mixture became burgundy in colour (indicative of the formation of a Ni(0) species). Stirring was continued at 70 deg C. for a further 20 mins to allow the catalyst to stabilise, then a solution of the 2,4-dimethoxy monomer (Example 4(a)) (10.94 g, 29.2 mmol) was added to the flange flask and stirring continued for 5.5 h. The mixture was allowed to cool to 25 deg C. Toluene (100 mL) was added and the stirred mixture cooled in an ice/water bath to 15 deg C., then concentrated hydrochloric acid, 37% (35 mL) was added dropwise (exotherm to 30 deg C.). The mixture was stirred for 10 mins, filtered and the filtrate transferred to a separating funnel. The organic layer was separated and was then concentrated in vacuo to give a green semisolid (13.91 g). This was dissolved in THF (40 mL) and precipitated into MeOH (120 mL). The solid was isolated by filtration under suction using a Buchner funnel and the filter cake washed with MeOH (60 mL). The solid was then dried in a vacuum oven (9.37 g). The solid was purified by dry column chromatography (eluent THF) three times to give the product as a yellow powder (8.05 g), which was characterised as follows: GPC Mn=4643 Daltons, $N_{av}$=15.

Oligomer 10 had a permittivity of 3.5 Fm$^{-1}$ at 1000 Hz, a mobility of 3.9×10$^{-5}$ cm$^2$V$^{-1}$s$^{-1}$ (linear mobility) and 2.3×10$^{-4}$ cm$^2$V$^{-1}$s$^{-1}$ (saturation mobility) at a channel length, L=40 μm

12. Preparation of 3,4,5-trimethoxy poytriarylamine oligomer (Oligomer 11) by polymerising 3,4,5-trimethoxy aniline with 4,4'-dibromobiphenyl

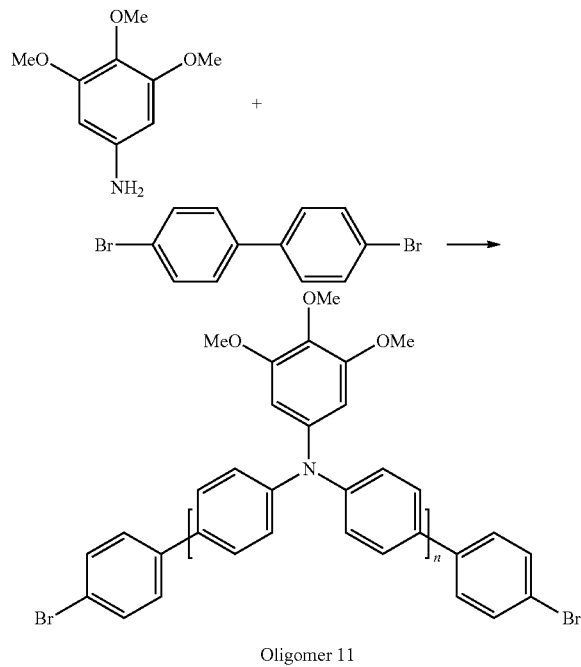

Oligomer 11

A mixture of 3,4,5-trimethoxyaniline (Fluorochem 008860, 2.28 g, 12.6 mmol), 4,4'-biphenyl (7.80 g) sodium tert-butoxide (5.05 g) in toluene (50 mL) was degassed by passing a stream of nitrogen through the solution for 15 minutes. Pd$_2$dba$_3$ (0.06 g) and P(tBu)$_2$-o-biphenyl (0.07 g) were then added and the mixture heated to 85 deg C. After approx. 1 hour, HPLC confirmed the presence of oligomers. Further amounts of 4-ethoxyaniline (3.42 g) and NaO$^t$Bu (5.05 g) were then added. After another 2 hours 4,4'-biphenyl (7.8 g), Pd$_2$dba$_3$ (0.06 g) and P(tBu)$_2$-o-biphenyl (0.07 g) were added and the mixture stirred at 85 deg C. overnight. After a total reaction time of 20 hours the mixture was allowed to cool to room temperature. and poured into water (~300 mL). The mixture was filtered through a GF/A filter and the cake washed with toluene and THF. The organic layer of the filtrate was separated and the aqueous extracted with THF (3×30 mL). The organic layers were combined, dried (MgSO$_4$), filtered and concentrated to give a brown semisolid (21.23 g). The crude product was dissolved in THF (50 mL) and added dropwise into methanol (100 mL). The precipitated solid was collected by filtration (Whatman No. 1 paper) and pulled dry (15.17 g). The solid was purified by dry column chromatography (eluent: dichloromethane followed by THF). The THF fractions were concentrated (10.0 g). The product was dissolved in THF (50 mL) and added dropwise into methanol (100 mL). The precipitated solid was collected by filtration (9.6 g). This material was purified again by dry column chromatography (eluent THF), the fractions collected were concentrated, dissolved in THF (50 mL) and poured into methanol (100 mL). The solid was collected by filtration and then dried in a vacuum oven (40 deg C.) overnight to give the product as a cream coloured amorphous solid (7.3 g), which was characterised as follows: GPC Mn=2502 Daltons, $N_{av}$=8.

Oligomer 11 had a permittivity of 3.9 Fm$^{-1}$ at 1000 Hz; a mobility of 6.0×10$^{-6}$ cm$^2$V$^{-1}$s$^{-1}$ (linear mobility) and 1.4×10$^{-6}$ cm$^2$V$^{-1}$s$^{-1}$ (saturation mobility) at a channel length, L=40 μm Formulation 6

Oligomer 11 and polyacene 1 (1,4,8,11-tetramethyl-6,13-bis(triethylsilylethynyl) pentacene) (1:1 ratio by weight) were dissolved in tetralin at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s then 1500 rpm for 20 s). Finally an Al gate electrode was described by shadow mask evaporation.

Mobility was 2.0 cm$^2$V$^{-1}$s$^{-1}$ (linear mobility, channel length 35 μm).

13. Bis(4-chlorophenyl)amine (Compound 4)

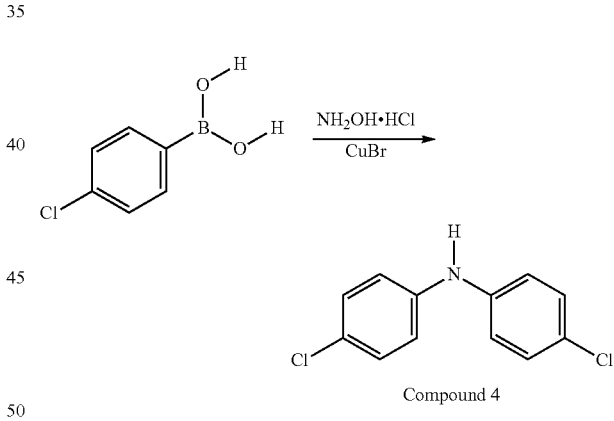

Compound 4

4-Chlorobenzeneboronic acid (45.00 g, 287 mmol), hydroxylamine hydrochloride (23.99 g, 345 mmol), anhydrous potassium carbonate (59.66 g, 432 mmol), copper(I) bromide (8.23 g, 57 mmol) and MeCN (500 mL) were charged to a 1 L 3-necked round-bottomed flask, fitted with a two-way adapter, thermometer, overhead stirrer and air condenser. The blue coloured reaction mixture was heated to 70 deg C. (became brown after about 40 mins). After 66 h, the brown mixture was allowed to cool to room temperature, and then filtered using a Buchner funnel. The filter cake was washed with acetonitrrile (MeCN, 100 mL) and DCM (200 mL). The cake was then slurried in DCM (200 mL) for 10 mins and filtered via suction using a Buchner funnel. The combined filtrates were evaporated in vacuo to afford a brown semisolid (22.28 g). The crude product was dissolved in DCM and dry loaded onto silica gel then purified by dry column chromatography, (gradient elution: 10% DCM: heptane then 20% DCM: heptane) to give the product as a brown solid (10.37 g). Recrystallisation from methanol gave the product as a yellow sold (9.29 g, 14%). $^1$H NMR (500 MHz) 7.22 (4H, d, J=8.7 Hz), 6.96 (4H, d, J=8.7 Hz), 5.63 (1H, b, N$\underline{H}$).

14. Preparation of bis(N-4-chlorophenyl)-2-cyanophenylamine

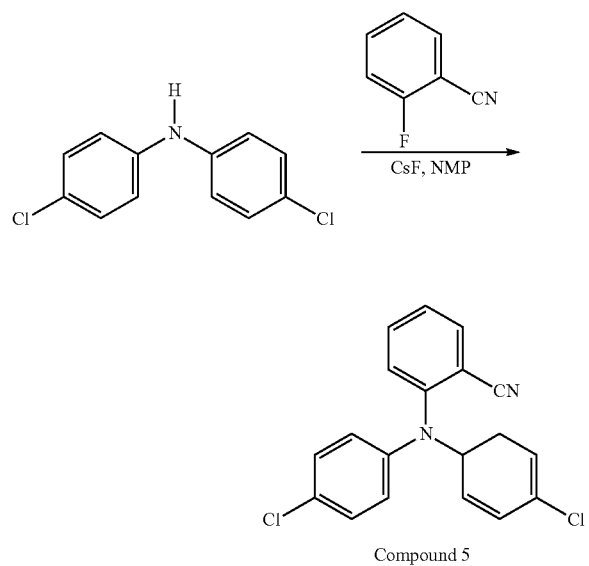

Compound 5

Bis(4-chlorophenyl)amine (Compound 4, 3.07 g, 12.89 mmol) and anhydrous NMP (32 mL) were charged to a 100 mL, 3-necked round-bottomed flask, fitted with a stirrer flea, nitrogen inlet/bubbler, water condenser, thermometer, and a 2M NaOH aqueous solution scrubber, followed by 2-fluorobenzonitrile and caesium fluoride. The red mixture was degassed for 30 mins, and then heated to 175 deg C. (The reaction mixture slowly becomes dark brown). After 16 h, analysis by liquid chromatography (LC) indicated the reaction was complete. The reaction mixture was allowed to cool to room temperature, diluted with toluene (190 mL) in a conical flask, dried over magnesium sulphate (30 mins) and filtered via suction. The filter cake washed with further toluene (50 mL) and pulled dry. The combined filtrates were evaporated in vacuo (48 deg C.), then under high vacuum at 94 deg C. for 6.5 h, to give to leave a brown oil (4.77 g). The crude product was recrystallized slowly from methanol (45 mL, 10 vols), cooled to 6 deg C., filtered and washed with cold (−18 deg C.) methanol (30 mL). This was dried in vacuo (vacuum oven, 40 deg C., 69 h) to give the desired product as brown needles (3.75 g, 85%). $^1$H NMR (600 MHz, CDCl$_3$) 7.60 (1H, dd, J=7.8 Hz, 1.6 Hz), 7.52-7.50 (1H, m), 7.24 (4H, d, J=8.9 Hz), 7.22-7.17 (2H, m), 6.94 (4H, d, J=8.9 Hz).

15. Preparation of 2-cyano polytriarylamine oligomer (Oligomer 12) by polymerising the amine monomer (Compound 5)

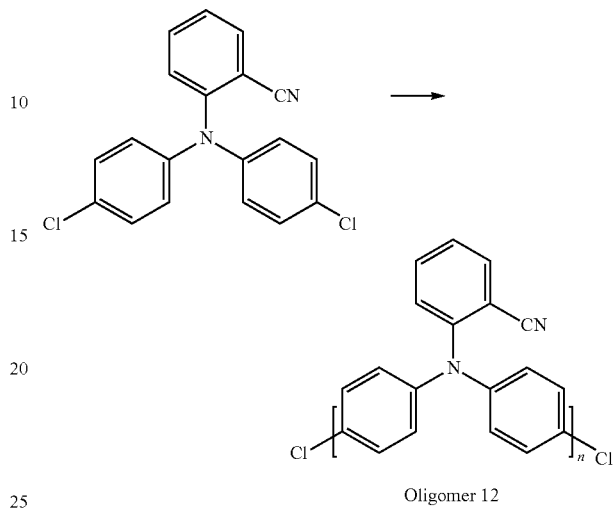

Oligomer 12

A 250 mL flange flask, fitted with a thermometer, overhead stirrer and water condenser, was flame-dried under nitrogen purge to 100 deg C., then allowed to cool to ambient temperature. Nickel(II) chloride (0.05 g, 0.39 mmol), zinc powder (3.02 g, 46.13 mmol), 2,2'-bipyridyl (0.090 g, 0.58 mmol), triphenylphosphine (2.00 g, 7.65 mmol) and anhydrous DMAc (80 mL) were charged in and the grey suspension stirred at 20 deg C. for 25 mins. The mixture was then heated to 70 deg C. (the burgundy colour of the catalyst formed as the mixture was heated) and held at 70 deg C. for a further 30 mins to allow the catalyst to stabilise. The monomer (5.02 g, 14.80 mmol) was added to the flange flask, rinsed in with anhydrous DMAc (10 mL) and stirring continued for 22 hr. The mixture was allowed to cool to 45 deg C., then toluene (90 mL) was added and the stirred mixture cooled in an ice/water bath to 10 deg C., then concentrated hydrochloric acid, 37% (35 mL) was added dropwise (exotherm to 25 deg C.; red colour disappears, turns grey/green). THF (80 mL) was added, the suspension was stirred for 15 mins and was then transferred to a separating funnel. The organic layer was separated, the aqueous layer extracted with THF and concentrated give a brown semisolid (11.21 g). The residue was taken up in THF (56 mL) then the solution added dropwise to rapidly-stirred methanol (260 mL) and the precipitated solid was filtered under suction using a Buchner funnel, the filter cake washed with methanol (2×40 mL) and pulled dry. The filter cake (22.78 g) was dried in a vacuum oven to leave a yellow powder (3.66 g). The material was purified by dry column chromatography (eluent: THF) three times. The product obtained (3.52 g) was dissolved in THF (11 mL) and poured slowly into methanol (33 mL). The precipitated solid was filtered under suction using a Buchner funnel, the filter cake washed with methanol and pulled dry. The solid was then dried in a vacuum oven to give the product as a yellow solid (2.94 g), which was characterised as follows: GPC Mn=2688 Daltons, $N_{av}$=8.

Oligomer 12 had a permittivity of 3.5 Fm$^{-1}$ at 1000 Hz. a mobility of $1.9\times10^{-6}$ cm$^2$V$^{-1}$s$^{-1}$ (linear mobility) and $3.2\times10^{-6}$ cm$^2$V$^{-1}$s$^{-1}$ (saturation mobility) at a channel length, L=40 μm

16. Preparation of bis(N-4-chlorophenyl)-4-cyanophenylamine (Compound 6)

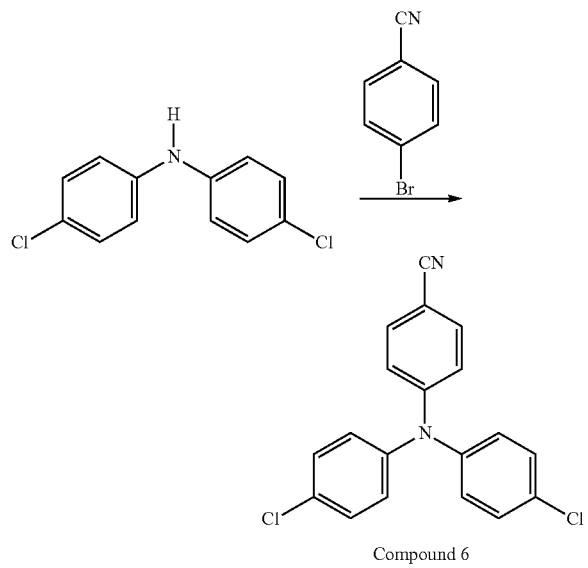

Compound 6

A 500 mL 3-necked round-bottomed flask, fitted with a thermometer, overhead stirrer, a two-way adapter nitrogen inlet/bubbler and water condenser, was flushed with nitrogen for 30 mins, then bis(4-chlorophenyl)amine (Example 6(a), 6.22 g, 26.13 mmol), 4-bromobenzonitrile (5.23 g, 28.75 mmol), NaO$^t$Bu (3.19 g, 33.18 mmol), 1,1'-bis(diphenylphosphino)ferrocene (0.78 g, 1.41 mmol) and anhydrous toluene (280 mL) were charged. The red/brown mixture was degassed for 38 mins, and then Pd$_2$(dba)$_3$ (0.43 g, 0.47 mmol) was added and the mixture heated to 80 deg C. under nitrogen. After 18 hrs, an extra 0.5 equiv. of 4-bromobenzonitrile (2.38 g) was added. After a further two hours another charge of catalyst (Pd$_2$(dba)$_3$, 0.43 g), 1,1'-bis(diphenylphosphino)ferrocene) (0.78 g 1.41 mmol) and NaOtBu (1.27 g) were added and heating continued overnight. After a total of 41 h, LC indicated the reaction was complete and it was allowed to cool to room temperature, diluted with water (250 mL), stirred for 10 mins, then transferred to a separating funnel and the phases allowed to separate. The bottom aqueous phase was removed and back-extracted with toluene (200 mL), and the combined organic extracts washed with brine (250 mL), dried over MgSO$_4$ (15 mins) and filtered under suction using a Buchner funnel and the filter cake washed with toluene (200 mL). The combined filtrates were evaporated in vacuo (50 deg C.) to afford a red/brown powder (14.87 g). The crude product was purified by dry flash column chromatography (gradient elution: 10% DCM/heptane to 50% DCM/heptane) to give the product as a yellow solid (7.99 g, 90%). $^1$H NMR (600 MHz, CDCl$_3$) 7.44 (2H, d, J=8.6 Hz), 7.28 (4H, d, J=8.6 Hz), 7.04 (4H, d, J=8.6 Hz), 6.95 (2H, d, J=8.6 Hz).

17. Preparation of 4-cyano polytriarylamine oligomer (Oligomer 13) by polymerising the amine monomer (Compound 6)

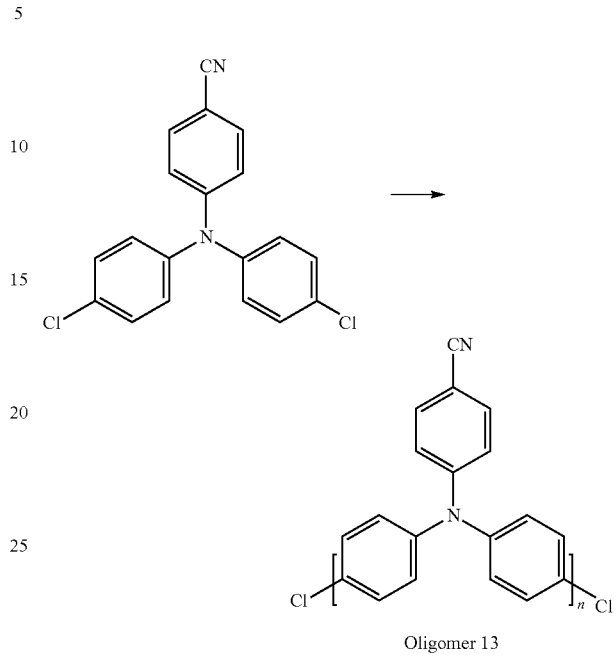

Oligomer 13

A 250 mL flange flask, fitted with a thermometer, overhead stirrer and water condenser, was flame-dried under nitrogen purge to 100 deg C., then allowed to cool to ambient temperature. Nickel(II) chloride (0.09 g, 0.69 mmol) zinc powder (5.38 g, 82.38 mmol), 2,2'-bipyridyl (0.16 g, 1.03 mmol), triphenylphosphine (3.58 g, 13.66 mmol) and anhydrous DMAc (80 mL) were charged and the grey suspension stirred at 20 deg C. for 25 mins. The burgundy colour of the catalyst formed after 15 mins at ambient temperature. The mixture was then heated to 70 deg C. and held at 70 deg C. for a further 30 mins to allow the catalyst to stabilise. The monomer (Example 7(a), 8.96 g) was added to the flange flask, rinsed in with anhydrous DMAc (10 mL) and stirring continued for 5 h. The mixture was allowed to cool to 45 deg C., then toluene (90 mL) was added and the stirred mixture cooled in an ice/water bath to 10 deg C., then concentrated hydrochloric acid, 37% (35 mL) was added dropwise (exotherm to 25 deg C.; mixture became grey/green in colour). THF (80 mL) was added; the suspension was stirred for 15 mins and was then transferred to a separating funnel. The organic layer was separated, the aqueous layer extracted with THF (2×40 mL). The combined organic extracts were concentrated give a green semi-solid (21.25 g). The residue was taken up in THF (90 mL) then the solution added dropwise to rapidly-stirred methanol (260 mL) and the precipitated solid collected by filtration using a Buchner funnel and washed with methanol (2×40 mL). The filter cake (40.04 g) was dried in a vacuum oven to afford a deep yellow powder (7.11 g). The material was purified by dry column chromatography (eluent: THF) three times. The product obtained (3.52 g) was dissolved in THF (11 mL) and poured slowly into methanol (33 mL). The precipitated solid was collected by filtration under suction using a Buchner funnel and the filter cake washed with methanol (30 mL). The solid (10.09 g) was then dried in a vacuum oven to give the product as a yellow solid (5.38 g), which was characterised as follows: GPC Mn=3341 Daltons, $N_{av}$=10.

Oligomer 13 had a permittivity of 3.4 $Fm^{-1}$ at 1000 Hz. a mobility of $9.1 \times 10^{-7}$ $cm^2V^{-1}s^{-1}$ (linear mobility) and $8.4 \times 10^{-7}$ $cm^2V^{-1}s^{-1}$ (saturation mobility) at a channel length, L=40 μm Formulation 7

Oligomer 13 and polyacene 1 (1,4,8,11-tetramethyl-6,13-bis(triethylsilylethynyl) pentacene) (1:1 ratio by weight) were dissolved in 1,2-dichlorobenzene at 2% total solids and spin coated (500 rpm for 5 s, then 1500 rpm for 60 s) onto patterned Au source/drain electrodes (50 nm thick Au treated with a 10 mM solution of pentafluorobenzene thiol in isopropyl alcohol). The fluoropolymer dielectric Cytop (Asahi Chemical Co.) was spin coated on top (500 rpm for 5 s then 1500 rpm for 20 s). Finally an Al gate electrode was described by shadow mask evaporation.

Mobility was 0.6 $cm^2V^{-1}s^{-1}$ (linear mobility, channel length 35 μm).

Comparative Example 1

2,4 Dimethyl Polytriarylamine Oligomer 2,4-dimethyl polytriarylamine ($N_{av}$=18) was obtained from High Force Research Ltd (Durham, UK). Comparative Example 1 had a permittivity of 3.0 $Fm^{-1}$ at 1000 Hz.

The invention claimed is:

1. An organic semiconductor composition comprising a polyacene compound and an organic binder,
   wherein said polyacene compound is selected from those of Formulae (4) and (5):

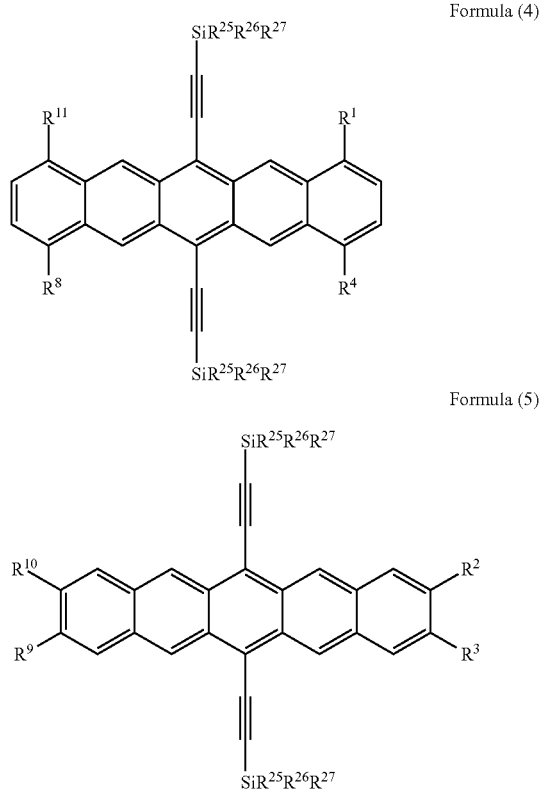

Formula (4)

Formula (5)

wherein $R^{25}$, $R^{26}$ and $R^{27}$ are independently selected from the group consisting of methyl, ethyl and isopropyl; and $R^1$, $R^2$, $R^3$, $R^4$, $R^8$, $R^9$, $R^{10}$ and $R^{11}$ are independently selected from the group consisting of $C_1$-$C_6$ alkyl, $C_1$-$C_6$ alkoxy and $C_6$-$C_{20}$ aryloxy, and said organic binder is a semiconducting binder comprising a unit of Formula (6):

Formula (6)

wherein $Ar_1$, $Ar_2$ and $Ar_3$, which may be the same or different, each represent, independently if in different repeat units, an optionally substituted $C_{6-40}$ aromatic group (mononuclear or polynuclear), wherein at least one of $Ar_1$, $Ar_2$ and $Ar_3$ is substituted with at least one polar or more polarizing group, and n=1 to 20, and said organic binder has a permittivity at 1000 Hz of between 3.4 and 8.0.

2. The composition according claim 1, wherein said binder has a permittivity at 1000 Hz of between 4.0 and 6.0.

3. The composition according claim 1, wherein said binder has a permittivity at 1000 Hz of between 3.4 and 4.5.

4. The composition according to claim 1, wherein $R^1$, $R^2$, $R^3$, $R^4$, $R^8$, $R^9$, $R^{10}$ and $R^{11}$ are independently selected from the group consisting of methyl, ethyl, propyl, n-butyl, isobutyl, t-butyl, methoxy, ethoxy, propyloxy and butyloxy groups.

5. The composition according to claim 1, wherein $R^1$, $R^4$, $R^8$ and $R^{11}$ are the same and are methyl or methoxy groups and $R^{25}$, $R^{26}$ and $R^{27}$ are the same and are ethyl or isopropyl groups.

6. The composition according to claim 5, wherein $R^1$, $R^4$, $R^8$ and $R^{11}$ are methyl groups and $R^{25}$, $R^{26}$ and $R^{27}$ are ethyl groups.

7. The composition according to claim 5, wherein $R^1$, $R^4$, $R^8$ and $R^{11}$ are methyl groups and $R^{25}$, $R^{26}$ and $R^{27}$ are isopropyl groups.

8. The composition according to claim 5, wherein $R^1$, $R^4$, $R^8$ and $R^{11}$ are methoxy groups and $R^{25}$, $R^{26}$ and $R^{27}$ are ethyl groups.

9. The composition according to claim 5, wherein $R^1$, $R^4$, $R^8$ and $R^{11}$ are methoxy groups and $R^{25}$, $R^{26}$ and $R^{27}$ are isopropyl groups.

10. The composition according to claim 1, wherein $R^2$, $R^3$, $R^9$ and $R^{10}$ are the same and are methyl or methoxy groups and $R^{25}$, $R^{26}$ and $R^{27}$ are the same and are ethyl or isopropyl groups.

11. The composition according to claim 10, wherein $R^2$, $R^3$, $R^9$ and $R^{10}$ are methyl groups and $R^{25}$, $R^{26}$ and $R^{27}$ are ethyl groups.

12. The composition according to claim 10, wherein $R^2$, $R^3$, $R^9$ and $R^{10}$ are methyl groups and $R^{25}$, $R^{26}$ and $R^{27}$ are isopropyl groups.

13. The composition according to claim 10, wherein $R^2$, $R^3$, $R^9$ and $R^{10}$ are methoxy groups and $R^{25}$, $R^{26}$ and $R^{27}$ are ethyl groups.

14. The composition according to claim 10, wherein $R^2$, $R^3$, $R^9$ and $R^{10}$ are methoxy groups and $R^{25}$, $R^{26}$ and $R^{27}$ are isopropyl groups.

15. The composition according to claim 1, wherein the polyacene compound is selected from the following compounds (A) to (F):

Compound (A)

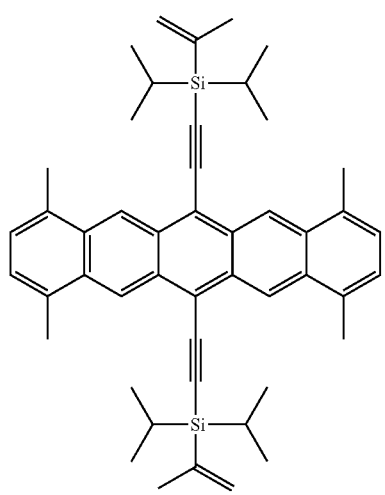

Compound (B)

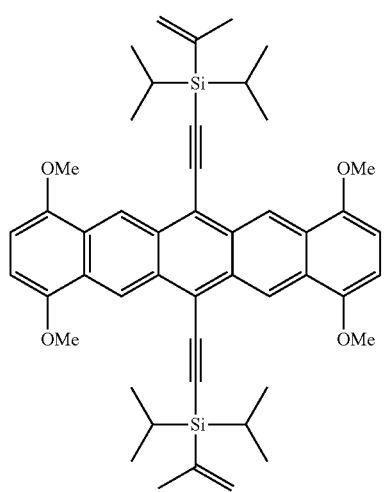

Compound (C)

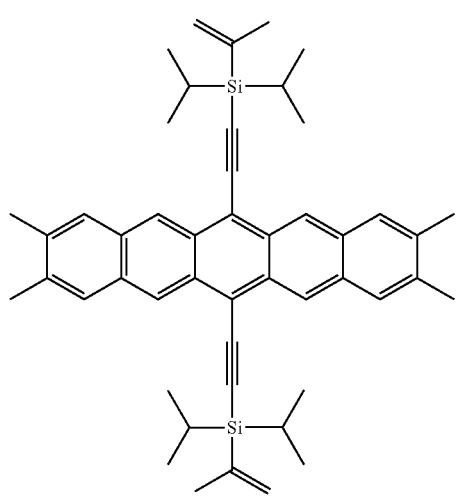

-continued

Compound (D)

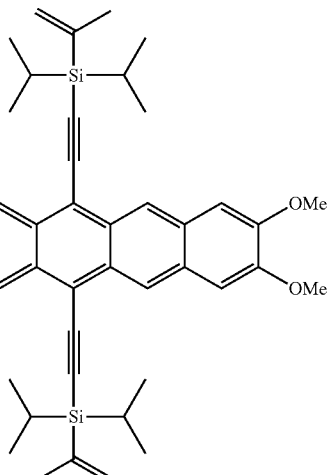

Compound (E)

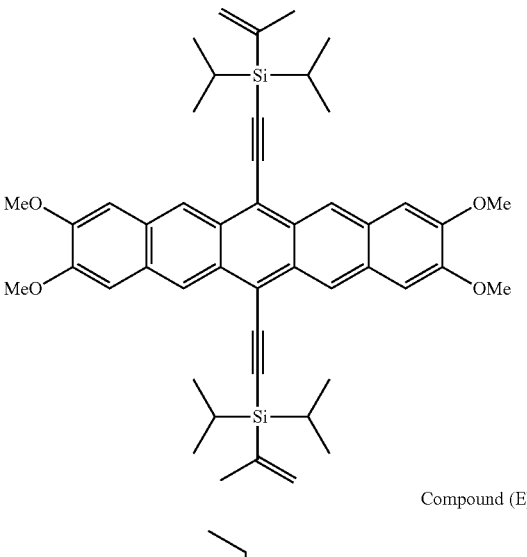

Compound (F)

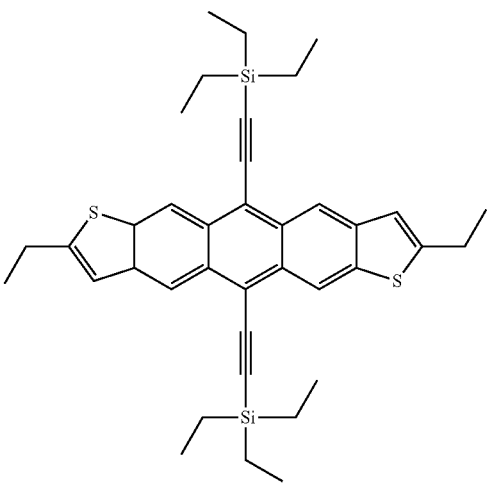

16. The composition according to claim 1, wherein said one or more polar or polarizing group(s) is independently selected from the group consisting of nitro group, nitrile group, $C_{1-40}$ alkyl group substituted with a nitro group, a nitrile group, a cyanate group, an isocyanate group, a thiocyanate group or a thioisocyanate group; $C_{1-40}$ alkoxy group optionally substituted with a nitro group, a nitrile group, a cyanate group, an isocyanate group, a thiocyanate group or a thioisocyanate group; $C_{1-40}$ carboxylic acid group optionally substituted with a nitro group, a nitrile group, a cyanate group, an isocyanate group, a thiocyanate group or a thioisocyanate group; $C_{2-40}$ carboxylic acid ester optionally substituted with a nitro group, a nitrile group, a cyanate group, an isocyanate group, a thiocyanate group or a thioisocyanate group; sulfonic acid optionally substituted with a nitro group, a nitrile group, a cyanate group, an isocyanate group, a thiocyanate group or a thioisocyanate group; sulfonic acid ester optionally substituted with a nitro group, a nitrile group, a cyanate group, an isocyanate group, a thiocyanate group or a thioisocyanate group; cyanate group, isocyanate group, thiocyanate group, thioisocyanate group; and an amino group optionally substituted with a nitro group, a nitrile group, a cyanate group, an isocyanate group, a thiocyanate group or a thioisocyanate group; and combinations thereof.

17. The composition according to claim 1, wherein said one or more polar or polarizing group(s) is independently selected from the group consisting of $C_{1-4}$ cyanoalkyl group, $C_{1-10}$ alkoxy group, nitrile group, amino group and combinations thereof.

18. The composition according to claim 1, wherein the polar or polarizing group is selected from the group consisting of methoxy, ethoxy, propoxy, butoxy, cyanomethyl, cyanoethyl, nitrile, $NH_2$ and combinations thereof.

19. The composition according to claim 1, wherein $Ar_1$, $Ar_2$ and $Ar_3$, are independently selected from the group consisting of $C_{6-10}$ aryl, $C_{7-12}$ aralkyl and $C_{7-12}$ alkaryl, any of which may be substituted with 1, 2, or 3 groups independently selected from $C_{1-2}$ alkoxy, $C_{1-3}$ cyanoalkyl, CN and mixtures thereof, and n=1 to 10.

20. The composition according to claim 1, wherein $Ar_1$, $Ar_2$ and $Ar_3$ are all phenyl which may be independently substituted with 1 or 2 groups selected from methoxy, cyanomethyl and CN and mixtures thereof, and n=1 to 10.

21. The composition according to claim 1, wherein said organic binder is a random or block copolymer of different triarylamine monomers.

22. The composition according to claim 1, wherein said organic binder comprises at least one unit selected from the following structures (G) to (J):

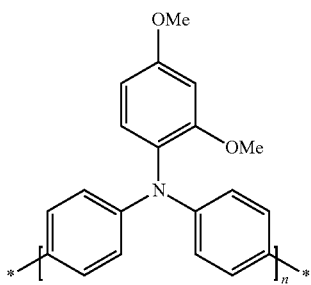

Compound (G)

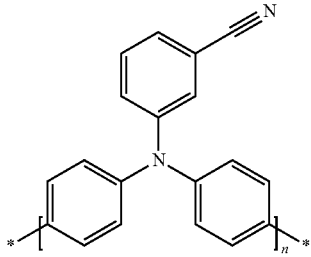

Compound (H)

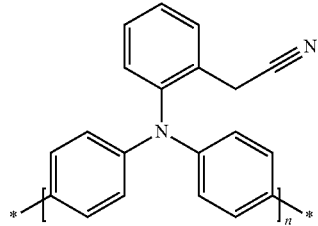

Compound (I)

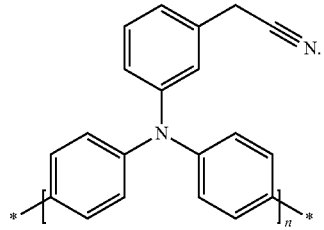

Compound (J)

23. The composition according to claim 1, wherein the organic binder has an electrical conductivity in the range of $10^3$ to $10^{-8}$ siemens per centimeter.

24. The composition according to claim 1, having a permittivity at 1000 Hz of between 3.4 and 8.

25. The composition according to claim 1, having an electrical conductivity in the range of $10^3$ to $10^{-8}$ siemens per centimeter.

26. The composition according to claim 1, further comprising a solvent selected from the group consisting of ketones, aromatic hydrocarbons, fluorinated solvents, and mixtures thereof.

27. The composition according to claim 1, wherein said composition has a charge mobility value of at least 0.5 $cm^2V^{-1}s^{-1}$.

28. The composition according to claim 27, wherein said composition has a charge mobility value of between 1.5 and 8.0 $cm^2V^{-1}s^{-1}$.

29. An organic semiconductor layer comprising the composition according to claim 1, optionally excluding solvent.

30. The semiconductor layer according to claim 29, wherein said layer has a charge mobility value of at least 0.5 $cm^2V^{-1}s^{-1}$.

31. The semiconductor layer according to claim 30, wherein said layer has a charge mobility value of between 1.5 and 8.0 $cm^2V^{-1}s^{-1}$.

32. A method of forming the organic semiconductor layer according to claim 29, comprising:
   a. mixing the organic semiconductor composition according to the present invention with a solvent to form a semiconductor layer formulation;
   b. depositing said formulation onto a substrate; and
   c. optionally removing the solvent to form an organic semiconductor layer.

33. The method according to claim 32, wherein said substrate is selected from the group consisting of polyamides, polycarbonates, polyimides, polyketones, polyethylene terephthalate (PET), polyethylene naphthalate (PEN), silica, alumina, silicon wafers and glass.

34. The method according to claim 32, wherein said solvent is selected from the group consisting of tetrahydrofuran, anisole, morpholine, toluene, o-xylene, m-xylene, p-xylene, 1,4-dioxane, acetone, methylethylketone, ethyl acetate, n-butyl acetate, dimethylformamide, dimethylacetamide, dimethylsulfoxide, tetralin, decalin, bromomesitylene and/or mixtures thereof.

35. The method according to claim 32, wherein the ratio of organic binder to polyacene compound in said semiconductor layer formulation is 20:1 to 1:20 by weight.

36. The method according to claim 32, wherein said deposition is carried out by spin coating, knife-coating, roll-to-roll web-coating, dip coating, ink-jet printing, screen printing, and/or offset lithography.

37. The method according to claim 32, wherein said solvent is removed by evaporation or drying.

38. An electronic device comprising the organic semiconductor composition or layer according to claim 1.

39. The electronic device according to claim 38, wherein said device is selected from the group consisting of organic field effect transistors (OFETS), integrated circuits, organic light emitting diodes (OLEDS), photodetectors, organic photovoltaic (OPV) cells, sensors, lasers, memory elements and logic circuits.

40. An ink-jet formulation containing a composition according to claim 1.

41. An organic semiconductor composition comprising a polyacene compound and an organic binder, wherein said polyacene compound is of Formula (3):

Formula (3)

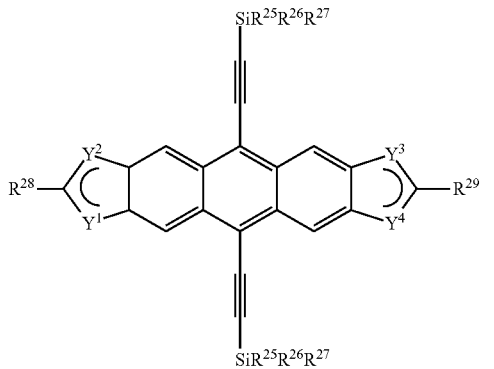

wherein $R^{25}$, $R^{26}$ and $R^{27}$ are independently selected from the group consisting of $C_1$-$C_6$ alkyl and $C_2$-$C_6$ alkenyl; $R^{28}$ and $R^{29}$ are independently selected from the group consisting of hydrogen, halogen, —CN, optionally fluorinated or perfluorinated, straight chain or branched $C_1$-$C_{20}$ alkyl, fluorinated or perfluorinated, straight chain or branched $C_1$-$C_{20}$ alkoxy, fluorinated or perfluorinated $C_6$-$C_{30}$ aryl and $CO_2R^{30}$, wherein $R^{30}$ is H, fluorinated or perfluorinated, straight chain or branched $C_1$-$C_{20}$ alkyl, and fluorinated or perfluorinated $C_6$-$C_{30}$ aryl; and $Y^1$, $Y^2$, $Y^3$ and $Y^4$ are independently selected from the group consisting of —CH=, =CH—, O, S, Se or $NR^{31}$, wherein $R^{31}$ is a hydrogen atom or a cyclic, straight chain or branched $C_1$-$C_{10}$ alkyl group; and said organic binder is a semiconducting binder comprising a unit of Formula (6):

Formula (6)

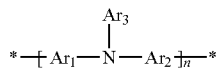

wherein $Ar_1$, $Ar_2$ and $Ar_3$, which may be the same or different, each represent, independently if in different repeat units, an optionally substituted $C_{6-40}$ aromatic group (mononuclear or polynuclear), wherein at least one of $Ar_1$, $Ar_2$ and $Ar_3$ is substituted with at least one polar or more polarizing group, and n=1 to 20, and said organic binder has a permittivity at 1000 Hz of between 3.4 and 8.0.

* * * * *